(12) United States Patent
Himeno et al.

(10) Patent No.: US 8,581,225 B2
(45) Date of Patent: Nov. 12, 2013

(54) VARIABLE RESISTANCE NONVOLATILE MEMORY DEVICE AND METHOD OF MANUFACTURING THE SAME

(75) Inventors: Atsushi Himeno, Osaka (JP); Haruyuki Sorada, Okayama (JP); Takumi Mikawa, Shiga (JP)

(73) Assignee: Panasonic Corporation, Osaka (JP)

( * ) Notice: Subject to any disclaimer, the term of this patent is extended or adjusted under 35 U.S.C. 154(b) by 120 days.

(21) Appl. No.: 13/379,460

(22) PCT Filed: Apr. 26, 2011

(86) PCT No.: PCT/JP2011/002432
§ 371 (c)(1),
(2), (4) Date: Dec. 20, 2011

(87) PCT Pub. No.: WO2011/135843
PCT Pub. Date: Nov. 3, 2011

(65) Prior Publication Data
US 2012/0104350 A1  May 3, 2012

(30) Foreign Application Priority Data

Apr. 28, 2010  (JP) ................. 2010-104478

(51) Int. Cl.
*H01L 27/26* (2006.01)
*H01L 47/00* (2006.01)
(52) U.S. Cl.
USPC ........... 257/4; 257/5; 257/2; 257/E47.005; 257/E27.002; 438/382; 438/381; 438/384
(58) Field of Classification Search
USPC ............ 257/2, 4, 5, E47.005, E27.002; 438/382, 381, 384; 365/385, 100, 148
See application file for complete search history.

(56) References Cited

U.S. PATENT DOCUMENTS 6,753,561 B1   6/2004  Rinerson et al.
6,870,755 B2 *  3/2005  Rinerson et al. .............. 365/148
(Continued)

FOREIGN PATENT DOCUMENTS

JP   10-335588    12/1998
JP   11-261027     9/1999
(Continued)

OTHER PUBLICATIONS

International Search Report issued Aug. 9, 2011 in International (PCT) Application No. PCT/JP2011/002432.

*Primary Examiner* — Thinh T Nguyen
(74) *Attorney, Agent, or Firm* — Wenderoth, Lind & Ponack, L.L.P.

(57) ABSTRACT

A manufacturing method includes forming, on a substrate, lower layer copper lines each being shaped into a strip, forming electrode seed layers each being shaped into a strip, on the respective lower layer copper lines using electroless plating, forming an interlayer insulating layer above the electrode seed layers, forming, in the interlayer insulating layer, memory cell holes, penetrating through the interlayer insulating layer and extending to the electrode seed layers, forming noble metal electrode layers on the electrode seed layers exposed in the respective memory cell holes using the electroless plating, forming, in the respective memory cell holes, variable resistance layers connected to the noble electrode layers, and forming, above the interlayer insulating layer and the variable resistance layers, upper layer copper lines each being shaped into a strip, connected to a corresponding one of the variable resistance layers, and crossing the lower layer copper lines.

18 Claims, 16 Drawing Sheets

(56) References Cited

U.S. PATENT DOCUMENTS

| | | |
|---|---|---|
| 2003/0003674 A1* | 1/2003 | Hsu et al. .................. 438/385 |
| 2003/0047764 A1 | 3/2003 | Joo |
| 2004/0142498 A1 | 7/2004 | Joo |
| 2006/0098472 A1 | 5/2006 | Ahn et al. |
| 2008/0121865 A1 | 5/2008 | Ahn et al. |
| 2009/0052225 A1 | 2/2009 | Morimoto |
| 2009/0174519 A1 | 7/2009 | Mikawa et al. |
| 2010/0264392 A1 | 10/2010 | Kawashima et al. |
| 2010/0321095 A1 | 12/2010 | Mikawa et al. |
| 2011/0074539 A1 | 3/2011 | Tsuji |
| 2011/0140828 A1 | 6/2011 | Mikawa et al. |
| 2011/0220861 A1 | 9/2011 | Himeno et al. |

FOREIGN PATENT DOCUMENTS

| | | |
|---|---|---|
| JP | 2003-163329 | 6/2003 |
| JP | 2006-140489 | 6/2006 |
| JP | 2006-203098 | 8/2006 |
| JP | 2010-021381 | 1/2010 |
| JP | 4427630 | 3/2010 |
| WO | 2005-087980 | 9/2005 |
| WO | 2006/075574 | 7/2006 |
| WO | 2007/116749 | 10/2007 |
| WO | 2009/139185 | 11/2009 |
| WO | 2009/150814 | 12/2009 |
| WO | 2010/050094 | 5/2010 |
| WO | 2010/064340 | 6/2010 |
| WO | 2010/119677 | 10/2010 |

* cited by examiner

FIG.1(a)
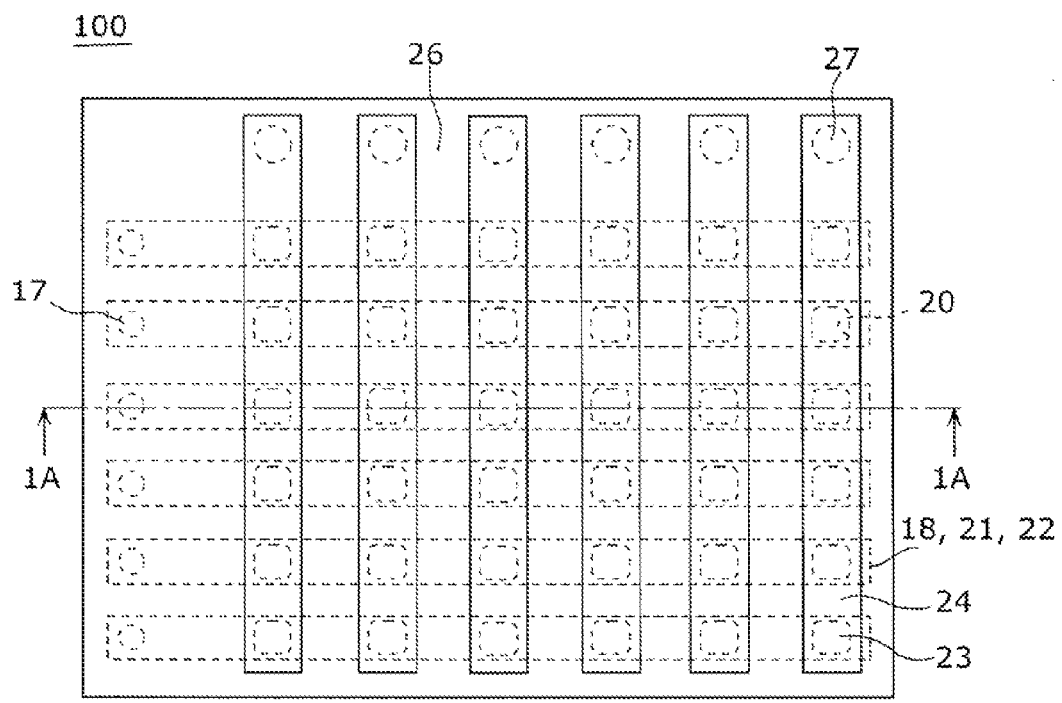
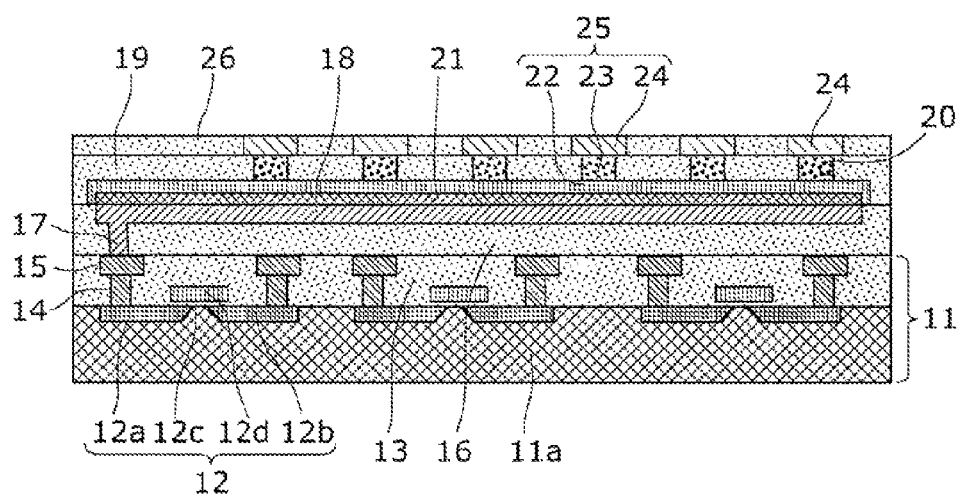
FIG. 1(b)

400

VARIABLE RESISTANCE NONVOLATILE MEMORY DEVICE AND METHOD OF MANUFACTURING THE SAME

TECHNICAL FIELD

The present invention relates to crosspoint variable resistance nonvolatile memory devices, and in particular to a variable resistance nonvolatile memory device having a configuration suitable to miniaturization and a method of manufacturing the same.

BACKGROUND ART

With the progress of the digital technology of electronic devices in recent years, nonvolatile semiconductor memory devices with a large capacity have been actively developed for storing data such as music, images, and information. For example, a nonvolatile semiconductor memory device which uses a ferroelectric as a capacity element has already been used in many fields. In addition to the nonvolatile semiconductor memory device which uses such a ferroelectric capacitor, a variable resistance nonvolatile memory device (hereinafter referred to as a ReRAM) formed by using a material whose resistance value changes in response to an electric pulse application and which holds the state has been attracting attention for the easiness to ensure consistency with a general semiconductor processing.

A nickel oxide (NiO) film, a vanadium oxide ($V_2O_5$) film, a zinc oxide film (ZnO), a niobium oxide ($Nb_2O_5$) film, a titanium oxide ($TiO_2$) film, a tungsten oxide ($WO_3$) film, a cobalt oxide (CoO) film, or the like is used as a variable resistance layer. It is known that such a transition metal oxide film indicates a specific resistance value when a voltage or current equal to or larger than a threshold is applied and maintains the resistance value until the next application of a voltage or current is provided, and can be manufactured using an existing DRAM processing as it is.

PTL 1 discloses a crosspoint ReRAM in which a memory plug is formed at the crosspoint of an x-direction conductive array line and a y-direction conductive array line. The memory plug includes a variable resistance memory element and a diode element having a metal-insulator-metal (MIM) configuration. The variable resistance memory element is made up of three layers including a lower electrode layer, a complex metal oxide layer, and an upper electrode layer. The diode element is made up of three layers including a metal layer, an insulating layer, and a metal layer. In addition, since an electrode layer that connects the variable resistance memory element and the diode element is provided, the memory plug has a stacking configuration of a total of seven layers.

In addition, PTL 2 discloses a crosspoint ReRAM having a resistance structure and a diode structure between a bit line and a word line.

PTL 3 discloses a crosspoint ReRAM provided with a variable resistance element including a lower electrode, a variable resistor, and an upper electrode between a bit line and a word line, and a nonlinear element connected in series to the variable resistance element.

CITATION LIST

Patent Literature

[PTL 1]
U.S. Pat. No. 6,753,561
[PTL 2]
Japanese Unexamined Patent Application Publication No. 2006-140489
[PTL 3]
Japanese Unexamined Patent Application Publication No. 2006-203098

According to the memory cell configuration disclosed by PTL 1, PTL 2, and PTL 3 described above, the variable resistance memory element and the diode element are formed at the crosspoint of the bit line and the word line. In forming such a memory cell, the bit line may be also served as the lower electrode of the variable resistance memory element, the word line may be also served as the upper electrode of the diode element, and the upper electrode of the variable resistance memory element and the lower electrode of the diode element may be integrated, for example. However, at least three layers of (i) the variable resistance layer making up the variable resistance memory element, (ii) the electrode layer, and (iii) the diode layer other than the electrode which makes up the diode element, still need to be stacked.

Such a memory cell can be manufactured according to, for example, a manufacturing method described below. As shown in FIG. 16(a), a variable resistance layer 2, an intermediate electrode layer 3, and a diode layer 4 are formed above a bit line 1 in this order to form a stack film. Then the stack film is fabricated into a pillar shape by applying photolithography and dry etching, as shown in FIG. 16(b). FIG. 16(b) depicts only one pillar. However, in practice, a large number of pillars for the respective memory cells are formed next to each other. Then, as shown in FIG. 16(c), an interlayer insulating layer 8 fills a space between the pillars of the stack film, and lastly, a word line 5 is formed on the interlayer insulating layer 8 to be connected to the diode layer 4.

The stack body including the bit line 1, the variable resistance layer 2, and the intermediate electrode layer 3 serves as a variable resistance element 6. The stack body including the intermediate electrode layer 3, the diode layer 4 (as a semiconductor layer), and the word line 5 serves as a metal-semiconductor-metal (MSM) diode element 7. The variable resistance element 6 and the diode element 7 make up one memory cell.

By the way, when a design rule is to be changed for miniaturization without changing the thickness of each of the variable resistance element 6 and the diode element 7 which make up the memory cell; that is, when miniaturization is to be carried out only in the crosswise direction without making a change in the lengthwise direction, the aspect ratio of the memory cell increases.

When a pillar-shaped memory cell with a high aspect ratio is to be formed by dry etching according to the method described above, a mask patterning layer is abraded during the etching, and thus the memory cell is likely to be shaped into a taper-like shape. It is possible to improve the durability of the mask patterning layer by increasing the thickness. However, this leads to another problem of impairing accuracy in fine patterning due to the increased thickness of the mask patterning layer.

As described above, the method of forming a pillar-shaped memory cell with a high aspect ratio through dry etching is not suitable to miniaturization. Therefore, it is difficult to implement a variable resistance nonvolatile memory device with a large capacity by such a method.

Furthermore, copper (Cu) that is a material used often for lines or electrodes is low in vapor pressure, for example, and a noble metal material such as platinum (Pt) or palladium (Pd) is low both in vapor pressure and reactivity. The property of the materials also makes it difficult to form a fine patterning.

In view of the above, as a promising approach to miniaturization, a method can be considered with which an interlayer insulating layer is formed in advance and a variable resistance element and a diode element are formed in a memory cell hole provided in the interlayer insulating layer. According to this method, a memory cell is formed by filling a variable resistance material, an electrode material, or a semiconductor material in the memory cell hole.

However, this method involves a huge problem that it is difficult to obtain a shape shown in FIG. 16(c), by forming the variable resistance layer, the electrode layer, the diode layer, and the like to be flat in the memory cell hole.

More specifically, as shown in FIG. 17, when a metal thin film layer 10 is to be formed at the bottom of a hole 9 by performing sputtering or chemical vapor deposition (CVD), the metal thin film layer 10 is formed inevitably on an undesired region such as the region on a side wall of the hole 9 or on the interlayer insulating layer 8 outside the hole 9. Accordingly, it is necessary to remove the undesired portion of the metal thin film layer 10 to leave only a desired portion flatly at the bottom of the hole 9.

However, particularly when the metal thin film layer 10 includes a noble metal material, since the noble metal material is low in reactivity and difficult to oxidize, it is tremendously difficult to remove the undesired portion from the metal thin film layer 10 by performing chemical mechanical polishing (CMP) using a liquid metal polishing agent made from a general oxidizing agent, solid abrasive grain, and the like.

In addition, even when the metal thin film layer 10 can physically be polished, mechanical polish acting of a fine grain included in the liquid polishing agent is likely to cause scratch that leaves a flaw on the interlayer insulating layer 8, which becomes a factor for causing decrease in yield due to line short circuit.

In addition, in the case where the metal thin film layer 10 includes the noble metal material, even when the undesired portion of the metal thin film layer 10 is to be removed using etch back, the noble metal material is low in both the vapor pressure and the reactivity and thus difficult to be fabricated by dry etching, as described above. Thus, the line short circuit is likely to occur due to problems such as deformation of patterning shape, etching residue, and a particle that is a problem that an etched noble metal material falls again on the surface of a wafer, which is a factor of causing decrease in yield.

As described above, performing patterning on the noble metal material by CMP or etch back can cause problems of production efficiency and quality of the variable resistance nonvolatile memory device.

In view of the above, the present invention has been conceived to solve the conventional problems described above, and an object of the present invention is to provide a method of manufacturing a variable resistance nonvolatile memory device in which a variable resistance element is embedded in the memory cell hole without performing patterning on a noble metal material by CMP or etch back, and a variable resistance nonvolatile memory device having a configuration suitable to such a manufacturing method.

SUMMARY OF THE INVENTION

In order to solve the above-described problems, an aspect of the method of manufacturing a variable resistance nonvolatile memory device according to the present invention includes: a step (A) of forming a plurality of lower layer copper lines on a substrate, each of the lower layer copper lines being shaped into a strip; a step (B) of forming a plurality of electrode seed layers each of which is shaped into the strip and disposed on a surface of a corresponding one of the lower layer copper lines, using electroless selective growth plating with which a metal thin film is precipitated not on an insulating body but only on the surfaces of the lower layer copper lines, each of the lower layer copper lines comprising a conductive material; a step (D2) of forming an interlayer insulating layer above the electrode seed layers and the substrate; a step (E2) of forming a plurality of memory cell holes in the interlayer insulating layer, each of the memory cell holes penetrating through the interlayer insulating layer and extending to a corresponding one of the electrode seed layers; a step (C2) of forming a plurality of noble metal electrode layers each of which is disposed on an exposed surface of a corresponding one of the electrode seed layers in a corresponding one of the memory cell holes, using the electroless selective growth plating; a step (F) of forming a plurality of variable resistance layers each of which is connected to the noble metal electrode layer in a corresponding one of the memory cell holes; and a step (G) of forming, above the interlayer insulating layer and the variable resistance layers, a plurality of upper layer copper lines each of which is (i) connected to a corresponding one of the variable resistance layers and (ii) shaped into a strip that crosses the lower layer copper lines.

Here, for the above-described electroless plating, chemical plating (also referred to as autocatalytic plating or non-autocatalytic plating) is preferably used, by which a plate film is precipitated utilizing oxidation reaction of a reducing agent included in a plating bath, in terms of a film quality of the plate film and film thickness controllability.

In addition, for the electroless plating, displacement plating (immersion plating) may be used, with which a plate film is precipitated by replacing a work-piece with a metal ion included in a plating bath with use of oxidation-reduction reaction caused by a difference in ionization tendencies.

Since chemical plating, as well as the displacement plating, uses oxidation-reduction reaction on the surface of a work-piece to cause a metal ion included in a plating bath to be precipitated, it is possible to selectively form a metal thin film layer only on the surface of the work-piece.

Therefore, according to such manufacturing methods, the electrode seed layer is formed only on the lower layer copper line and an undesired electrode seed layer is not precipitated on the interlayer insulating layer, in step (B). In addition, the noble metal electrode layer is precipitate only on the electrode seed layer exposed to the bottom of the memory cell hole, in step (C2). In addition, since oxidation-reduction reaction of the plating bath does not occur on the interlayer insulating layer or on the side wall of the memory cell hole, which are formed by the interlayer insulating layer, an undesired electrode seed layer is not precipitated.

As described above, by using electroless plating, the electrode seed layer is selectively precipitated only on the lower layer copper lines and the noble metal electrode layer is selectively precipitated only on the electrode seed layers exposed to the bottoms of the memory cell holes, and thus it is possible to form an electrode seed layer shaped into the same strip as the lower layer copper line and a noble metal electrode layer having a dot shape for each of the memory cell holes, without performing patterning processes such as CMP and etching.

As a result, it is possible to realize miniaturization, which was difficult by etching fabrication. In addition, when the noble metal electrode layer is formed on the entire surface of the electrode seed layer by electroless plating, the line width of the lower layer copper line including the electrode seed layer and the noble metal electrode layer after forming the electrode seed layer and the noble metal electrode layer increases by the thicknesses of the electrode seed layer and the noble metal electrode layer. Accordingly, a space between lower layer copper lines adjacent to each other is narrowed, and thus short circuit is more likely to occur.

However, when the noble metal electrode layer is formed only on the bottoms of the memory cell holes, compared to the case where the noble metal electrode layer is formed on the entire surface of the electrode seed layer, short circuit between adjacent lines is less likely to occur because the line width of the lower layer copper line increases only by the thickness of the electrode seed layer.

In addition, when the noble metal electrode layer is formed only on the bottoms of the memory cell holes, a use amount of the noble metal material can be reduced compared to the case where the noble metal electrode layer is formed on the entire surface of the electrode seed layer, and thus it is possible to manufacture a variable resistance nonvolatile memory device having a large-capacity at low costs.

In addition, since the noble metal electrode layer and the variable resistance layer are embedded in the memory cell hole which is easily miniaturized, it is possible to manufacture a variable resistance nonvolatile memory device having a large-capacity.

In addition, by using a metal material having a catalytic property such as nickel, zinc, iron, and an alloy of them for the electrode seed layer provided between the lower layer copper line and the noble metal electrode layer, it is possible to form the noble metal electrode layer even with a electroless plating bath including a reducing agent which does not show catalytic activity on the surface of copper. It is therefore possible to increase options of the reducing agent used for the plating bath.

In addition, when the noble metal electrode layer is formed through the displacement plating with which a noble metal is precipitated on a work-piece utilizing the difference in ionization tendencies using a metal or an alloy having the ionization tendency greater than copper or noble metal for the electrode seed layer, displacement reaction occurs more stably with the noble metal ion included in the electrode seed layer and the plating bath, and thus it is possible to cause a noble metal film to be precipitated more evenly.

In addition, when the chemical plating which uses the oxidation reaction of a reducing agent included in the plating bath, a hydrogen gas or nitrogen gas occur during the plate processing, there is a problem of a pinhole occurring in a plate film due to a bubble of the gas attached to the plated surface or the surface of the plate film that is precipitated. On the other hand, in such a manufacturing method, it is possible to perform electroless plate processing on a significantly flat surface by forming an electrode seed layer using electroless plate on the lower layer copper line embedded in the interlayer insulating layer through damascene processing. In addition, since the plated surface is significantly flat, it is possible to prevent a bubble form staying on the plated surface by agitation of plating bath and adding a low-frequency oscillation to the substrate. Thus, a pinhole can be prevented from occurring in the plate film, and thus it is possible to manufacture a variable resistance nonvolatile memory device having high reliability.

In addition, according to the above-described manufacturing method, it is possible to form an electrode seed layer and a noble metal electrode layer continuously by electroless plating. Accordingly, since a step of oxidizing or altering the surface layer of the electrode seed layer is not included after forming the electrode seed layer by electroless plating, a washing treatment, remedial treatment, and the like on the surface layer of the electrode seed layer can be omitted prior to the step of forming the noble metal electrode layer by electroless plating, and thus it is possible to stably form a noble metal electrode layer. In addition, it is possible to reduce the manufacturing processes, and since the plating processing is used, an affinity with a step of forming a copper line using damascene processing is high as well.

In addition, according to such a manufacturing method, the variable resistance element is embedded in the memory cell hole, patterning processing using dry etching is not performed. Therefore, it is possible to form the variable resistance layer while avoiding, in principle, the etching that involves a concern regarding a reaction against etching gas, oxidation reduction damage, damage caused by charging.

In addition, the above-described step (F) includes step (F1) of forming a first variable resistance layer connected to the noble metal electrode layer, in each of the memory cell holes, and step (F2) of forming the second variable resistance layer above the first variable resistance layer in each of the memory cell holes, the first variable resistance layer and the second variable resistance layer comprise a metal oxide of the same type, and the oxygen content atomic percentage of the first variable resistance layer is higher than the oxygen content atomic percentage of the second variable resistance layer.

According to the variable resistance nonvolatile memory device that is manufactured by the above-described method, it is possible to reliably cause a resistance change in an interfacial surface region between the first variable resistance layer and the noble metal electrode layer. Thus the polarity of an electric pulse to be applied for resistance change in a desired direction (to high resistance state or to low resistance state) is uniquely determined, making it possible to obtain a stable operation characteristic as a memory device. This is because that, since the resistance change operation is caused by an oxidation-reduction reaction near an electrode of the variable resistance layer, the first variable resistance layer having oxygen that can contribute to oxidation reduction is placed near the interfacial surface between the variable resistance layer and the noble metal electrode layer, thereby allowing stable resistance change operation.

In addition, between the step (F) and the step (G), a step (H) of forming a plurality of diode elements each of which is disposed on and connected to a corresponding one of the variable resistance layers may be included.

According to the variable resistance nonvolatile memory device that is manufactured by the above-described method, it is possible to prevent crosstalk to other memory cells using a diode element, while causing a sufficient current to flow in a target memory cell for changing and detecting a resistance state of the variable resistance layer, and thus it is possible to manufacture a variable resistance nonvolatile memory device with excellent reproducibility of variable resistance characteristic and high reliability.

In order to solve the above-described problems, an aspect of the method of manufacturing a variable resistance nonvolatile memory device according to the present invention includes: a substrate; a plurality of lower layer copper lines formed on the substrate, each of the lower layer copper lines being shaped into a strip; a plurality of electrode seed layers each of which is shaped into the strip and formed only on a surface of a corresponding one of the lower layer copper lines; an interlayer insulating layer formed above the electrode seed layers and the substrate; a plurality of noble metal electrode layers each of which is flatly formed only on a surface of the electrode seed layer in a corresponding one of memory cell hole regions penetrating through the interlayer insulating layer and extending to the electrode seed layers, the noble metal electrode layer being connected to the electrode seed layer; a plurality of variable resistance layers each of which is formed in a corresponding one of the memory cell hole regions and connected to a corresponding one of the noble metal electrode layers; and a plurality of upper layer copper lines formed above the interlayer insulating layer and the variable resistance layers, each of the upper layer copper lines being (i) connected to a corresponding one of the variable resistance layers and (ii) shaped into a strip that crosses the lower layer copper lines.

According to the above-described configuration, since the variable resistance layer is embedded in the memory cell hole that is easily miniaturized, it is possible to implement a variable resistance nonvolatile memory device of a variable resistance type that has a large capacity and is suitable to further integration.

In addition, the electrode seed layer shaped into the strip same as the strip shape of the lower layer copper line is provided to cover the lower layer copper line, and the electrode seed layer comprises nickel or the like which has a high density, a high melting point, and a small diffusion rate of copper in the electrode seed layer, thereby allowing the electrode seed layer to serve as a top cap layer that prevents the copper included in the lower layer copper line from diffusing into the interlayer insulating layer or the noble metal electrode layer.

In addition, since adhesion between copper and noble metal is weak, the electrode seed layer is provided which comprises nickel or the like that has a good adhesion to copper and a good adhesion to noble metal, between the lower layer copper line and the noble metal electrode layer, thereby allowing the electrode seed layer to serve as a adhesion layer between the lower layer copper line and the noble metal electrode layer.

Therefore, by providing the electrode seed layer, it is possible to prevent an insulation failure or line disconnection due to diffusion of the lower layer copper line to the interlayer insulating layer, or deterioration in variable resistance characteristic due to diffusion of the lower layer copper line to the noble metal electrode layer. In addition, by providing the electrode seed layer, it is possible to prevent delamination of the lower layer copper line and the noble metal electrode layer, thereby allowing the variable resistance nonvolatile memory device having high reliability to be implemented.

In addition, according to the above-described configuration, each of the variable resistance layers includes: a first variable resistance layer formed in a memory cell hole region to be connected to the noble metal electrode layer; and a second variable resistance layer formed above the first variable resistance layer in the memory cell hole region, the first variable resistance layer and the second variable resistance layer comprise the same metal oxide, and the oxygen content atomic percentage of the first variable resistance layer is higher than the oxygen content atomic percentage of the second variable resistance layer.

According to the above-described configuration, since it is possible to reliably cause a resistance change in an interfacial surface region between the first variable resistance layer and the noble metal electrode layer, the polarity of an electric pulse to be applied for resistance change in a desired direction (to high resistance state or to low resistance state) is uniquely determined, making it possible to obtain a stable operation characteristic as a memory device. This is because that, since the resistance change operation is caused by an oxidation-reduction reaction near an electrode of the variable resistance layer, the first variable resistance layer having oxygen that can contribute to oxidation reduction is placed near the interfacial surface between the variable resistance layer and the noble metal electrode layer, thereby allowing stable resistance change operation.

In addition, in the above-described structure, a plurality of diode elements each of which is disposed on and connected to a corresponding one of said variable resistance layer may be included.

According to the above-described configuration, it is possible to prevent crosstalk to adjacent memory cells while causing a sufficient current to flow in reading or writing, thereby allowing implementation of the variable resistance nonvolatile memory device with excellent reproducibility of variable resistance characteristic and high reliability.

The above-described objects, other objects, features, and advantageous effects are clarified by the detailed descriptions of preferred embodiments below with reference to the attached drawings.

It is to be noted that, in the descriptions of Claims and Description, the phrase "connecting to a variable resistance layer" means electrically connecting to a variable resistance layer and is a concept including both aspects of a direct connection; that is, being in contact, and an indirect contact via other conductive layer and the like.

As described above, according to a manufacturing method of the present invention, it is possible to manufacture a variable resistance nonvolatile memory device having a configuration suitable to miniaturization and larger capacity, in which a variable resistance element is embedded in a memory cell hole, without performing patterning on a noble metal material by CMP or etch back. Therefore, an advantageous effect of excluding, in principle, problems in production efficiency and quality which might occur due to a step of performing patterning on the noble metal material by CMP and etch back.

BRIEF DESCRIPTION OF DRAWINGS

FIG. 1(a) is a plan view explaining a configuration of a variable resistance nonvolatile memory device that is the base of an embodiment of the present invention. FIG. 1(b) is a cross-sectional view of the variable resistance nonvolatile memory device of FIG. 1(a) taken along the line 1A-1A and viewed in the direction indicated by arrows.

DESCRIPTION OF EMBODIMENTS

Figure 2:
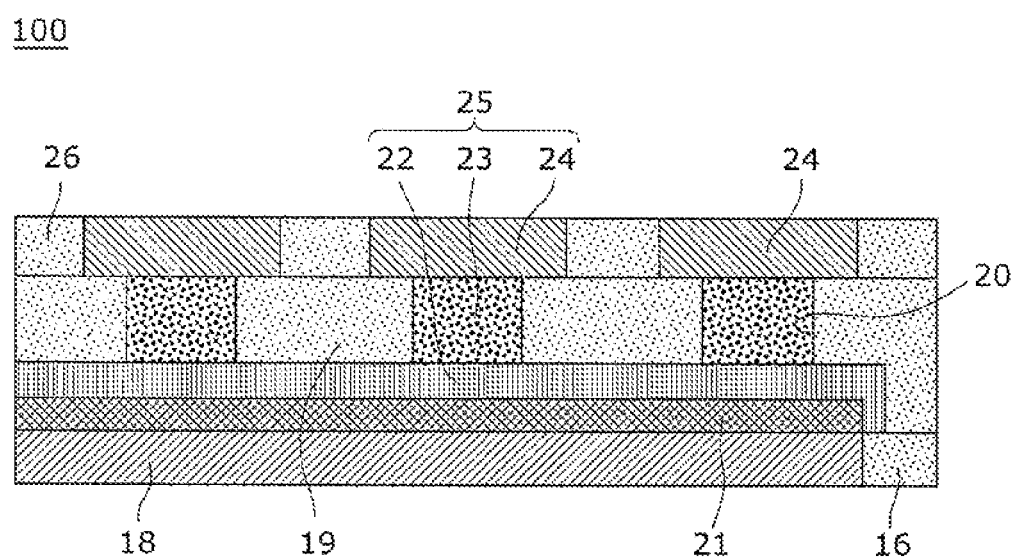
FIG. 2 is a cross-sectional view of a main section for showing a configuration of a variable resistance element of the variable resistance nonvolatile memory device that is the base of an embodiment of the present invention.

The following describes embodiments according to the present invention, with reference to the drawings. It is to be noted that the same reference numerals are assigned to the same elements and descriptions for them may be omitted. In addition, typical shapes are provided to a transistor, a variable resistance element, and so on, and the number of each of the elements illustrated are also examples for easy illustration.

First, as a preparation, a configuration, a manufacturing method, and an advantageous effect of a basic variable resistance nonvolatile memory device that is the base of an embodiment of the present invention will be described. The basic variable resistance nonvolatile memory device explained here includes a part of the characteristics of a variable resistance nonvolatile memory device according to an embodiment of the present invention. This explanation and subsequent explanations for embodiments will sufficiently explain the characteristic configurations, the manufacturing methods, and the advantageous effects of the variable resistance nonvolatile memory device according to the present invention.

(A Variable Resistance Nonvolatile Memory Device that is the Base of an Embodiment of the Present Invention)

FIGS. 1(a) and (b) are diagrams explaining a configuration of a variable resistance nonvolatile memory device 100 that is the base of an embodiment of the present invention. FIG. 1(a) is a plan view and FIG. 1(b) is a cross-sectional view of a cross section taken along the line 1A-1A of FIG. 1(a) and viewed in the direction indicated by the arrows. In addition, FIG. 2 is an enlarged cross-sectional view of a main section for showing a configuration of a variable resistance element 25.

As shown in FIGS. 1(a) and (b) and FIG. 2, the variable resistance nonvolatile memory device 100 includes: a substrate 11; a second interlayer insulating layer 16 formed on the substrate 11; lower layer copper lines 18 each of which is shaped into a strip and embedded conductors 17, which comprise copper and are formed in the second interlayer insulating layer 16; electrode seed layers 21 each of which is shaped into the strip and disposed only on the surface of a corresponding one of the lower layer copper lines 18; noble metal electrode layers 22 each of which is shaped into the strip and disposed only on the surface of a corresponding one of the electrode seed layers 21; a third interlayer insulating layer 19 formed on the noble metal electrode layers 22; variable resistance layers 23 each of which is formed in a corresponding one of the memory cell holes 20 penetrating through the third interlayer insulating layer 19 and extending to the surface of the respective noble metal electrode layers 22, and which is connected to a corresponding one of the noble metal electrode layers 22; a fourth interlayer insulating layer 26 formed on the third interlayer insulating layer 19; and upper layer copper lines 24 formed in the fourth interlayer insulating layer 26 and above the insulating layer 19 and the variable resistance layers 23, each of which is connected to a corresponding one of the variable resistance layers 23, crosses the lower layer copper lines 18, and shaped into a strip.

The substrate 11 in the present application refers to a semiconductor circuit board in which active elements 12 such as transistors are integrated using a silicon single crystal substrate 11a and which includes a first interlayer insulating layer 13. A transistor including a source region 12a, a drain region 12b, a gate insulating film 12c, and a gate electrode 12d is exemplified in FIG. 1(b) as one of the active elements 12. However, the active element 12 provided in the substrate 11 is not limited to such a transistor, and generally includes an element necessary for a memory circuit, such as a DRAM.

Each of the lower layer copper lines 18 is shaped into a strip and spaced apart from one another in the width direction of the strip. The electrode seed layers 21 and the noble metal electrode layers 22 formed above the lower layer copper lines 18 are stacked and formed into a shape substantially overlapping one another (a shape of the strip same as the lower layer copper lines 18) viewed from a stacking direction.

Each of the noble metal electrode layers 22 may include a noble metal of a single type, may include stacked metals of two or more types, or may include a metal of a single type in which another metal is doped. By using, as a material used for the noble metal electrode layer 22, an alloy of at least two types of metals including an electrode material easy to migrate into the variable resistance layer 23 and an electrode material difficult to migrate into the variable resistance layer 23, it is possible to stably develop a resistance changing phenomenon and to prevent an interfacial surface from losing flatness due to the migration of the noble metal electrode layer 22 into the variable resistance layer 23. This is because that, when the electrode material of the noble metal electrode layers 22 migrates into the variable resistance layers 23 and the interfacial surfaces lose flatness, an electric field concentrates to a projection portion of the noble metal electrode layers 22, leading to a significant variation in a variable resistance characteristic.

The variable resistance nonvolatile memory device 100 further includes upper layer copper lines 24 each of which is shaped into a strip on the interlayer insulating layer 19 in a direction crossing the lower layer copper lines 18 (for example, orthogonally crossing direction). Each of the upper layer copper lines 24 is shaped into a strip and spaced apart from one another in the width direction of the strip shape. Memory cell holes 20 are formed at crosspoints of the upper layer copper lines 24 and the lower layer copper lines 18 which cross three-dimensionally. Each of the memory cell holes 20 is formed such that the surface of a corresponding one of the noble metal electrode layers 22 formed above the lower layer copper lines 18 and the electrode seed layers 21 is exposed to the bottom of the memory cell holes 20.

The variable resistance layers 23 are formed so as to fill the respective memory cell holes 20. Each of the variable resistance elements 25 includes: a corresponding one of the variable resistance layers 23; and the noble metal electrode layer 22 and a corresponding one of the upper layer copper lines 24 which connects to the variable resistance layer 23. An oxygen-deficient transition metal oxide film or a perovskite oxide film is used for the variable resistance layer 23. As the oxygen-deficient transition metal oxide film, a tantalum oxide ($TaO_x$) film, a nickel oxide ($NiO)_x$ film, a hafnium oxide ($HfO_x$) film, a ferric oxide ($FeO_x$) film, a vanadium oxide ($VO_x$) film, a zinc oxide ($ZnO_x$) film, a niobium oxide ($NbO_x$) film, a titanium oxide ($TiO_x$) film, a tungsten oxide ($WO_x$) film, a cobalt oxide ($CoO_x$) film, or a copper oxide ($CuO_x$) film can be used, for example. As the perovskite oxide film, $PrCaMnO_3$, $LaCaMnO_3$, $SrTiO_3$, and the like can be used.

Here, the oxygen-deficient oxide refers to an oxide of which an atomic ratio that is the ratio of the number of deficient oxygen atoms to a total number of the oxygen atoms (hereinafter simply referred to as an oxygen-deficient degree) is larger than an atomic ratio of an oxide having stoichiometric composition. For example, taking the tantalum oxide as an example, the tantalum oxide $Ta_2O_5$ having a stoichiometric composition includes 2.5 times larger number of oxygen atoms than a tantalum atom. The tantalum oxide of which the oxygen-deficient degree is higher than an oxygen-deficient degree of a tantalum oxide represented as $Ta_2O_5$, in other words, the tantalum oxide having a nonstoichiometric composition that satisfies $0 \leq x \leq 2.5$ when represented as $TaO_x$ is called oxygen-deficient tantalum oxide. In the case of a tantalum oxide, for example, the stoichiometric composition is $Ta_2O_5$, and the oxygen-deficient degree is 0% in this case. In the case where the oxygen-deficient tantalum oxide is defined as $TaO_x$, the oxygen-deficient degree of the tantalum oxide when x=1.5 is represented as (2.5−1.5)/2.5=40%. Among them, the oxygen-deficient tantalum oxide ($TaO_x$) is preferable in terms of stability of the variable resistance characteristics and reproducibility for manufacturing. The following describes an example when the variable resistance layer 23 comprises the oxygen-deficient tantalum oxide ($TaO_x$). Here, oxygen-deficient means a composition including less oxygen compared to the stoichiometric composition, when represented as $TaO_x$, regarding the composition ratio of Ta and O. The range of x in $TaO_x$ is preferably $0 \leq x \leq 2.5$, and more preferably $0.8 \leq x \leq 1.9$.

The variable resistance layer may comprise two types of transition metal oxide layers having oxygen-deficient degrees different from each other (not illustrated in FIG. 1(b)). Here, the two types of transition metal oxide layers may have a stacking configuration including a first transition metal oxide layer and a second transition metal oxide layer which comprise the same transition metal. In addition, another stacking configuration may be used which includes a first transition metal oxide layer comprising a first transition metal and a second transition metal oxide layer comprising a second transition metal different from the first transition metal.

The oxygen-deficient degree of the second transition metal oxide layer (hereinafter abbreviated as a second oxide layer) is lower than the oxygen-deficient degree of the first transition metal oxide layer (hereinafter abbreviated as a first oxide layer). In other words, the resistance value of the second oxide layer is higher than the resistance value of the first oxide layer. With the above-described configuration, voltages applied between the lower electrode (the noble metal electrode layer 22 in FIG. 1(b)) and the upper electrode (the upper layer copper line 24 in FIG. 1(b)) of the variable resistance element during the resistance change are distributed more to the second transition metal oxide layer, so that it is possible to facilitating oxidation-reduction reaction occurring in the second transition metal oxide layer. Here, the second oxide layer is placed to be in contact with the noble metal electrode layer 22, and the first oxide layer is placed to be in contact with the upper layer copper line 24.

In addition, when materials of the first transition metal and the second transition metal are different from each other, it is preferable that a standard electrode potential of the second transition metal is smaller than a standard electrode potential of the first transition metal. The reason is because the resistance changing phenomenon is considered to occur as a result of a change in a resistance value caused by the oxidation-reduction reaction in a minute filament (conductive path)

formed in the second oxide layer having a high resistance. A stable resistance change can be obtained by, for example, using oxygen-deficient tantalum oxide for the first oxide layer and titanium oxide ($TiO_2$) for the second oxide layer. Titanium (standard electrode potential=−1.63 eV) is a material having a low standard electrode potential than tantalum (standard electrode potential=−0.6 eV). With a larger value of the standard electrode potential, the material is less likely to oxidize. The oxidation-reduction reaction is more likely to occur in the second oxide layer by disposing, in the second oxide layer, a transition metal oxide with a smaller standard electrode potential than a standard electrode potential of the first oxide layer.

The resistance changing phenomenon of the variable resistance film which includes any one of the above-described materials and has the stack structure is considered to occur as a result of a change in a resistance value caused by the oxidation-reduction reaction in a minute filament formed in the second oxide layer having a high resistance. More specifically, it is considered that, when a positive voltage with respect to the upper layer copper line 24 is applied to the noble metal electrode layer 22 on the second oxide layer, an oxygen ion in the variable resistance film is attracted to the second oxide layer, causing an oxidation reaction in the minute filament formed in the second oxide layer, thereby increasing the resistance of the minute filament. On the other hand, it is considered that, when a negative voltage with respect to the upper layer copper line 24 is applied to the noble metal electrode layer 22 on the second oxide layer, an oxygen ion in the second oxide layer is forced to the first oxide layer, causing a reduction reaction in the minute filament formed in the second oxide layer, thereby decreasing the resistance of the minute filament.

it is preferable that the noble metal electrode layer 22 connected to the second oxide layer having a lower oxygen-deficient degree comprises a material such as platinum (Pt), iridium (Ir), and palladium (Pd), which have higher standard electrode potentials compared to a material comprised by the transition metal and the upper layer line 24 included in the second oxide layer. With such a configuration, it is possible to selectively cause the oxidation-reduction reaction in the second oxide layer near the interfacial surface between the noble metal electrode layer 22 and the second oxide layer, and thus to obtain a stable resistance changing phenomenon.

It is to be noted that, as shown in FIG. 1(a), the upper layer copper lines 24 extend to an outside of a region in which the variable resistance elements 25 are arranged in a matrix. In addition, the lower layer copper lines 18 and the upper layer copper lines 24 are connected (to be precise, electrically connected) to the respective active elements 12 in a region different from the matrix region in which the variable resistance elements 25 are arranged. More specifically, in FIG. 1(b), the lower layer copper lines 18 are connected to the respective source regions 12a of the active elements 12 via the embedded conductors 17, the lines 15, and the embedded conductors 14. It is to be noted that, although not illustrated in FIG. 1(b), the upper layer copper lines 24 may be connected to other active elements via the embedded conductor 27 (see FIG. 1(a)).

In addition, for the third interlayer insulating layer 19 and the fourth interlayer insulating layer 26, a silicon oxide ($SiO_2$) formed by CVD, a TEOS-$SiO_2$ film formed by CVD using ozone ($O_3$) and tetraethoxysilane (TEOS), a silicon oxycarbide film (SiOC film) that is a low dielectric constant material, or a silicon fluorine oxide film (SiOF film) may be used.

In addition, in order to facilitate forming a memory cell hole in the third interlayer insulating layer 19, the interlayer insulating layer may include plural layers, using (i) a film having an etching resistance against dry etching in which fluorocarbon etching gas such as $C_4F_8$ and $C_5F_8$ is used, specifically, a silicon nitride (SiN) film, a silicon oxynitride (SiON) film, a silicon carbonitride (SiCN) film, or the like, formed by CVD, on the lower layer of the third interlayer insulating layer 19, and (ii) an insulating oxide material of a film type other than the above-described SiN and SiON for an upper layer.

Next, the variable resistance layer 23 included in the variable resistance element 25 can be formed using the above-described oxygen-deficient transition metal oxide, through reactive sputtering or the like, through which a target comprising a transition metal included in the transition metal oxide is sputtered in an atmosphere including an oxygen. Such an oxygen-deficient transition metal oxide material changes a resistance state to a specific state when a voltage or current equal to or larger than a threshold is applied, and maintains the resistance state until the next application of a voltage or current equal to or larger than a threshold is provided.

A basic method of manufacturing the variable resistance nonvolatile memory device 100 will be described with reference to FIGS. 3(a) to (d), FIGS. 4(a) to (c), and FIGS. 5(a) to (c). It is to be noted that, in FIGS. 3(a) to (d), FIGS. 4(a) to (c), and FIGS. 5(a) to (c), the configuration of only an upper portion from the second interlayer insulating layer 16 including the lower layer copper line 18 is illustrated for simplification of the drawings.

FIGS. 3(a) to (d) are diagrams showing processes of forming, by electroless plating, the electrode seed layer 21 and the noble metal electrode layer 22 above the lower layer copper line 18 embedded in the second interlayer insulating layer 16, and further forming the third interlayer insulating layer 19 thereon.

Figure 3A:
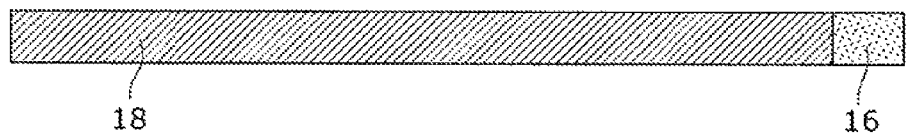
FIGS. 3(a) to (d) are diagrams showing processes of a method of manufacturing the variable resistance nonvolatile memory device that is the base of an embodiment of the present invention, from a process of forming an electrode seed layer and a noble metal electrode layer to be stacked above a lower layer copper line embedded in an interlayer insulating layer to a process of further forming an interlayer insulating layer on the noble metal electrode layer.

First, FIG. 3(a), the lower layer copper line 18 is embedded in the second interlayer insulating layer 16. This can be formed through processes as described blow. First, line grooves are formed, each of which is formed into a strip for embedding a corresponding one of the lower layer copper lines 18 in the second interlayer insulating layer 16. This can be easily formed using photolithography and insulating film etching techniques used in a general semiconductor processing. The lower layer copper lines 18 each of which has a shape shown in FIG. 3(a) can be embedded, by performing CMP, for example, after forming a conductive film that will be formed into the lower layer copper lines 18 by filling the line grooves with copper or the like through sputtering, CVD, or electroplating.

It is to be noted that each of the lower layer copper lines 18 may have a stack structure including a barrier metal layer on the lower layer of the copper layer and a top cap layer on the upper layer of the copper layer, in order to prevent copper from diffusing into the interlayer insulating layer. For the barrier metal layer and the top cap layer of the copper line, cobalt-tungsten-phosphorus (CoWP) alloy, titanium-tungsten nitride (TiWN), titanium (Ti), titanium nitride (TiN), tantalum (Ta), tantalum nitride (TaN), and the like, are generally used.

In addition, as shown in FIG. 1(a), the embedded conductor 17 is embedded in the second interlayer insulating layer 16 in addition to the lower layer copper line 18. The embedded conductor 17 and the lower layer copper line 18 in the second interlayer insulating layer 16 may be formed simultaneously through dual damascene processing, or may be formed separately through single damascene processing.

In addition, in order to reduce the parasitic capacitance between the lines, fluoride-containing oxide (SiOF, for example), carbon-containing nitride (SiCN, for example), an organic resin material (polyimide, for example), or the like is used for the second interlayer insulating layer 16.

Figure 3B:
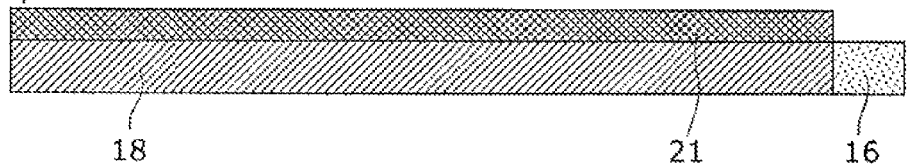

In the process shown in FIG. 3(b), the electrode seed layer 21 is formed on the surface of the lower layer copper lines 18 by electroless plating. By using the electroless plating, the electrode seed layer 21 is selectively formed on the surface of the lower layer copper line 18, and the electrode seed layer 21 is not formed on the second interlayer insulating layer 16.

In addition, since the electrode seed layer 21 is formed to cover the surface of the lower layer copper line 18, the electrode seed layer 21 serves also as a top cap layer that prevents copper from diffusing into the interlayer insulating layer after forming the interlayer insulating layer on the lower layer copper line 18 in the subsequent processing.

The electrode seed layer 21 is formed by the electroless plating, using a nickel-phosphorus (Ni—P) alloy. For the electroless plating using the nickel-phosphorus alloy, nickel plating bath may be used which includes hypophosphite such as sodium hypophosphite as a reducing agent. In this case, the copper surface may be dipped in advance into solution of palladium chloride for a few seconds before the electroless plating, to provide a palladium (Pd) catalytic layer. This is because that, by impregnating solution of hypophosphorous acid with a metal of an iron group element or a platinum group element such as iron (Fe), nickel, cobalt (Co), palladium, and the like, the metal surface serves as a catalytic agent, causing oxidation reaction of a hypophosphite ion.

Furthermore, in the formation of the electrode seed layer 21, nickel plating bath using dimethylamine borane (DMAB) as the reducing agent or nickel plating bath using hydrazidine as the reducing agent may be used in addition to the nickel plating bath using the hypophosphite as the reducing agent as described above.

When the nickel plating bath using the dimethylamine borane as the reducing agent is used, a nickel-boron alloy precipitates. In addition, since copper exhibits a catalytic property to the oxidation reaction of the dimethylamine borane, there is an advantage that the above-described process of providing the palladium catalytic agent is not necessary. However, the nickel plating bath using the hypophosphite or the dimethylamine borane as the reducing agent has a disadvantage that a hydrogen gas is produced during the plate processing.

Furthermore, when the nickel plating bath using the hydrazidine as the reducing agent is used, the composition of a plate film that precipitates is substantially only the nickel metal. In addition, with the plating bath including the hydrazidine, there is an advantage that a hydrogen gas is not produced during plate processing. However, since the reducing capacity of the hydrazidine is small compared to the hypophosphite or the like, there are disadvantages that it is necessary to be used with strong alkaline solution, a plating speed easily varies according to the pH value of the plating bath, and the plating bath is likely to be unstable.

Thus, in terms of preparation, management, and stability of the plating bath, the nickel plating bath using hypophosphite as the reducing agent most excels. Also, it costs less than other nickel plating baths, and thus it excels in mass productivity and cost performance as well.

In addition, in forming the electrode seed layer 21, electroless plating is performed on the significantly flat lower layer copper line 18 embedded in the interlayer insulating layer 16 by damascene processing. Thus, since the plated surface is significantly flat, it is possible to prevent adhesion, on the plated surface, of hydrogen gas bubbles produced during the plate processing, by adding agitation and low-frequency vibration of the plating bath, allowing preventing a pinhole from occurring in a plate film.

Figure 3C:
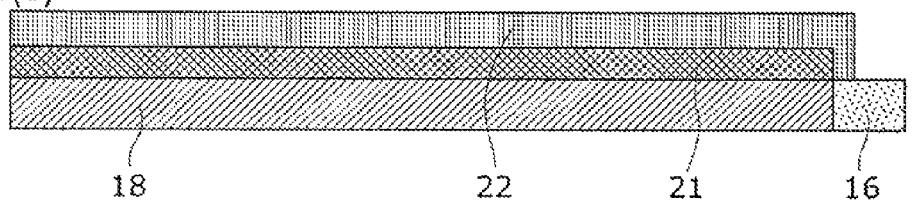

Next, in the process shown in FIG. 3(c), the noble metal electrode layer 22 is formed on the surface of the electrode seed layer 21 by electroless plating.

Here, since the oxygen-deficient tantalum oxide (TaO$_x$) is used for the variable resistance layer 23, platinum (Pt) or palladium (Pd), each of which is an electrode material that improves the variable resistance characteristic of TaO$_x$, is preferably used for the noble metal electrode layer 22.

As the plating bath used for the electroless plating for forming the noble metal electrode layer 22, the palladium plating bath or the platinum plating bath is preferable, in each of which hydrazidine or formate is used as the reducing agent.

Here, oxygen-deficient tantalum oxide is used for the variable resistance layer 23, and platinum or palladium is used for the noble metal electrode layer 22. The reason is because it is necessary to cause an electrode material to be connected which has a standard electrode potential sufficiently larger than a standard electrode potential indicating the easiness of oxidation reduction of tantalum so that the oxygen-deficient tantalum oxide shows resistance change due to oxidation-reduction reaction.

In view of the above, platinum ($V_{Pt}$=+1.118 V) or palladium ($V_{Pd}$=0.915 V) each of which has a standard electrode potential sufficiently larger than a standard electrode potential of tantalum ($V_{Ta}$=−0.6 V) is used for the noble metal electrode layer 22. When an impurity is incorporated into the noble metal electrode layer 22 and the standard electrode potential decreases, the oxidation-reduction reaction of the variable resistance layer 23 slows down, causing a possible characteristic deterioration such as a decrease in variable resistance ratio or a decreases in endurance characteristic (write endurance).

Therefore, it is preferable to use a noble metal plating bath which uses hydrazidine or formate as the reducing agent and with which a plate film including no impurity precipitates.

In addition, although phosphorus is included by 2 to 8% in a plate film that precipitates, palladium plating bath using hypophosphite as the reducing agent may be used. For measuring phosphorus concentration in a plate film, X-ray spectrometry using an energy-dispersive X-ray spectrometer or molybdic acid emission method may be used.

Figure 3D:
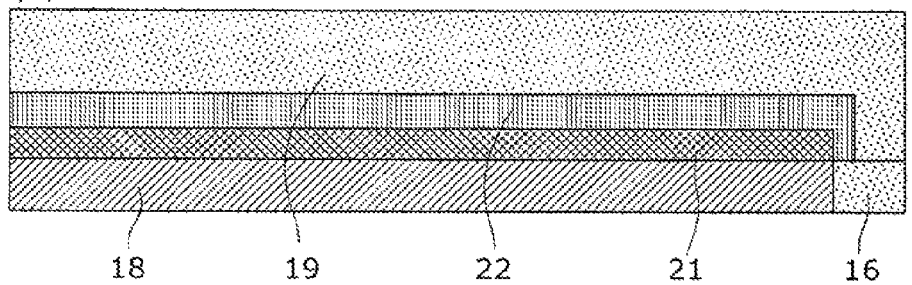

Next, In the process shown in FIG. 3(d), the third interlayer insulating layer 19 comprising TEOS-SiO$_2$ is formed by CVD for example, on the substrate 11 that includes the lower layer copper line 18, the electrode seed layer 21, and the noble metal electrode layer 22. It is to be noted that a variety of materials can be used as the third interlayer insulating layer 19 as described above.

Figure 4A:
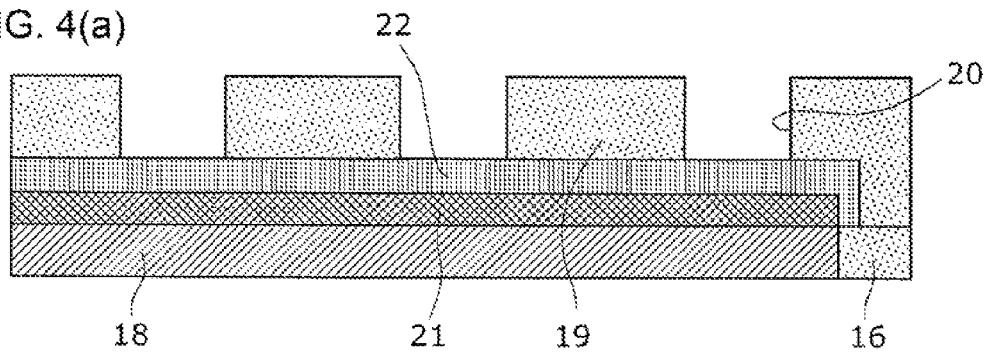
FIGS. 4(a) to (c) are diagrams showing processes of the method of manufacturing the variable resistance nonvolatile memory device that is the base of an embodiment of the present invention, from a process of forming a memory cell hole that connects to the noble metal electrode layer at a predetermined position on the interlayer insulating layer on the noble metal electrode layer to a process of embedding a variable resistance layer in the memory cell hole.
Figure 4B:
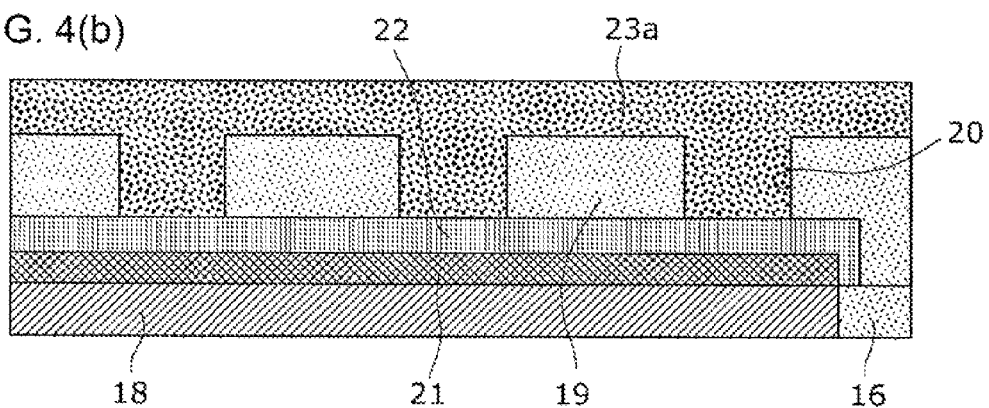
Figure 4C:
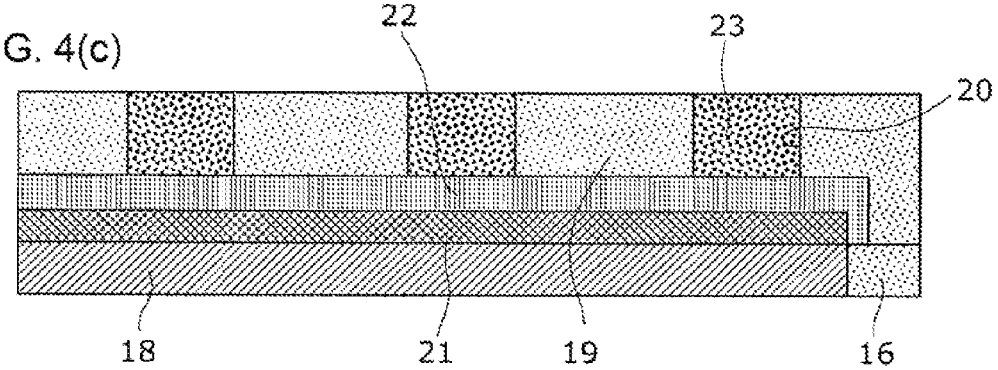

FIGS. 4(a) to (c) are diagrams which show processes from a process of forming the memory cell hole 20 that extends to the noble metal electrode layer 22 at a predetermined position of the third interlayer insulating layer 19 to a process of embedding the variable resistance layer 23 in the memory cell hole 20.

In the process shown in FIG. 4(a), memory cell holes 20 are formed, each of which penetrates through the third interlayer insulating layer 19 to the surface of a corresponding one of the noble metal electrode layers 22. The memory cell hole 20 is formed at a constant arrangement pitch along the lengthwise direction of the lower layer copper line 18, the electrode seed layer 21, and the noble metal electrode layer 22, for example. The memory cell hole 20 has a shape smaller than the width of each of the lower layer copper line 18, the electrode seed layer 21, and the noble metal electrode layer 22. It is to be noted that, although FIG. 1(a) shows a rectangular shape, any other shapes including circle and oval may be applied.

Next, in the process shown in FIG. 4(b), a resistant thin film layer 23a that serves as the variable resistance layer 23 is formed on the third interlayer insulating layer 19 including the memory cell holes 20. The variable resistance layer 23 is formed by sputtering oxygen-deficient tantalum oxide, for example. It is to be noted that, as a film formation method, CVD, ALD (atomic layer deposition), and the like may be used in addition to sputtering.

In addition, after metal Ta film is formed, the Ta film may be processed by thermal oxidation or plasma oxidation to form $TaO_x$.

Next, in the process shown in FIG. 4(c), the resistant thin film layer 23a on the interlayer insulating layer 19 is removed using the CMP process. As described above, the variable resistance layer 23 is embedded in the memory cell hole 20 such that the variable resistance layer 23 is connected to the noble metal electrode layer 22. It is to be noted that the method of removing the resistant thin film layer 23a is not limited to CMP but etch back method may also be used.

Figure 5A:
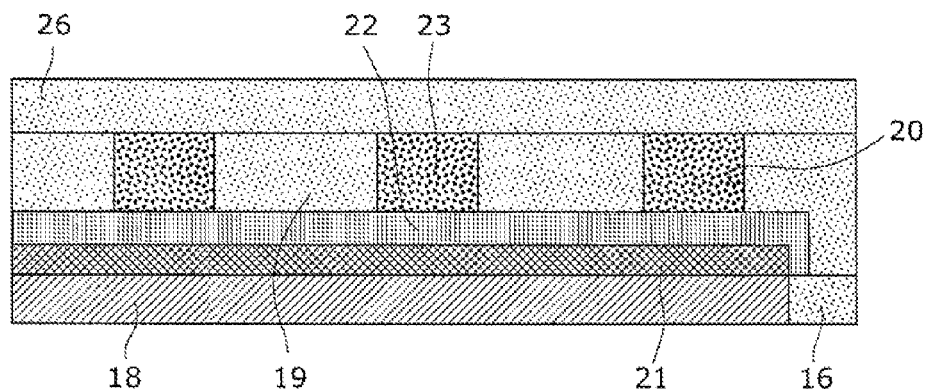
FIGS. 5(a) to (c) are diagrams showing processes of the method of manufacturing the variable resistance nonvolatile memory device that is the base of an embodiment of the present invention, through a process of forming an upper layer copper line to connect to the variable resistance layer.
Figure 5B:
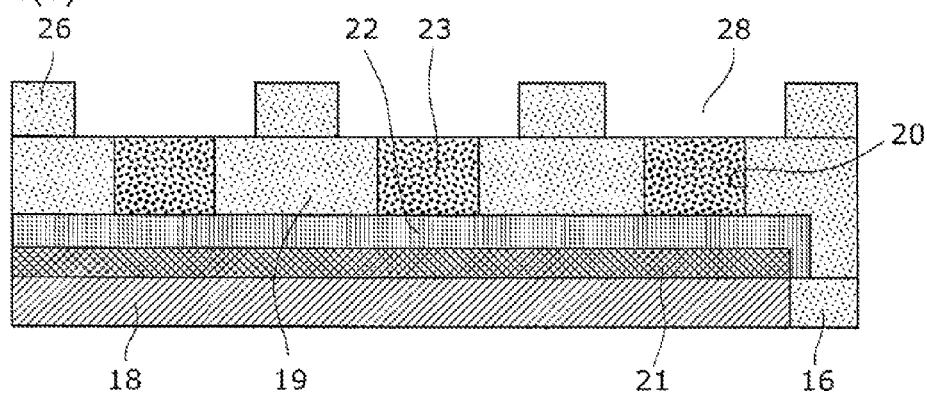
Figure 5C:
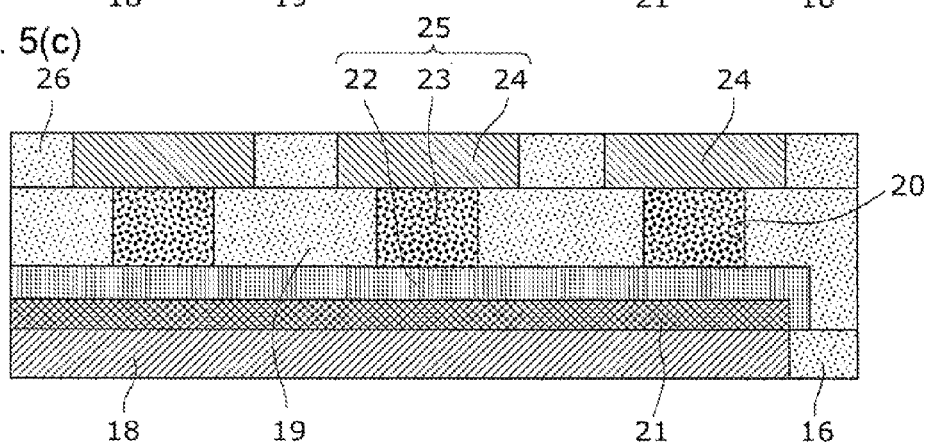

FIGS. 5(a) to (c) are diagrams which show processes from a process of forming the interlayer insulating layer 26 on the variable resistance layer 23 and the interlayer insulating layer 19 to a process of forming the upper layer copper line 24 on the interlayer insulating layer 19 such that the upper layer copper line 24 is be connected to the variable resistance layer 23.

In the process shown in FIGS. 5(a) to (c), the upper layer copper line 24 is formed in the fourth interlayer insulating layer 26 provided on the variable resistance layer 23 and the third interlayer insulating layer 19 such that the upper layer copper line 24 is connected to the variable resistance layer 23, in the same manner as the method of forming the lower layer copper line 18. The upper layer copper line 24 is formed on the third interlayer insulating layer 19 to be larger than at least the memory cell hole 20 and to be shaped into a strip crossing the lower layer copper line 18. As the upper layer copper line 24, a material same as the material of the lower layer copper line 18 can be used.

It is to be noted that, when forming the upper layer copper line 24, the embedded conductor 27 (shown in FIG. 1(a)) connected to the upper layer copper line 24 is also simultaneously formed by filling a conductive material in a predetermined memory cell hole, or the like. The upper layer copper line 24 may be electrically connected to a not-illustrated active element, via the embedded conductor 27. Through the processes described above, the variable resistance nonvolatile memory device 100 as shown in FIGS. 1(a) and (b) and FIG. 2 can be manufactured.

The following describes a variable resistance nonvolatile memory device according to some of the embodiments of the present invention with reference to the configuration and the manufacturing method of the variable resistance nonvolatile memory device 100 that is the base of the present invention, as necessary.

Embodiment 1

Figure 6:
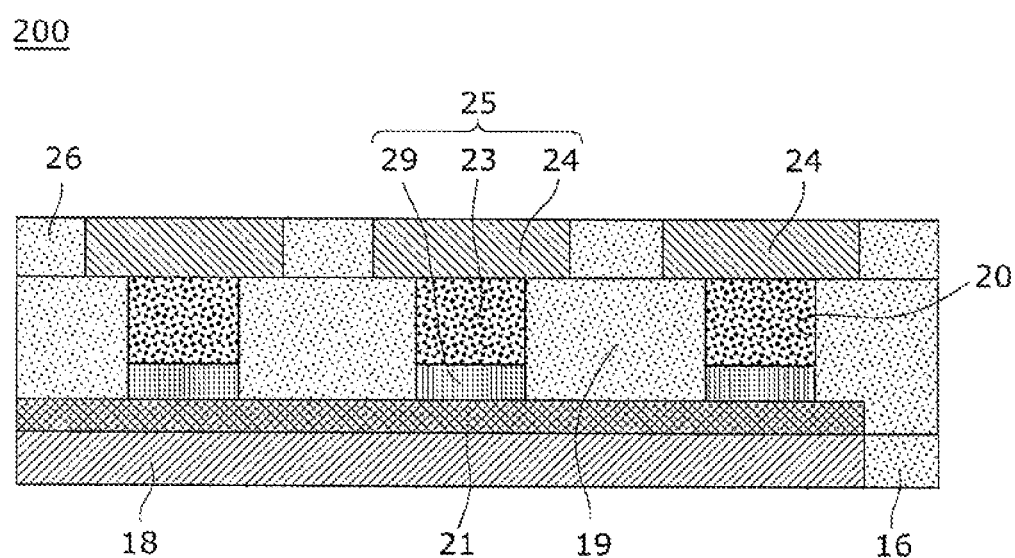
FIG. 6 is a cross-sectional view of a main section for showing a configuration of a variable resistance element of the variable resistance nonvolatile memory device according to Embodiment 1 of the present invention.

FIG. 6 is a diagram explaining a configuration of a variable resistance nonvolatile memory device 200 according to Embodiment 1 of the present invention, and a cross-sectional view of an enlarged main section for showing a configuration of the variable resistance element 25.

The variable resistance nonvolatile memory device 200 according to the present embodiment has the same basic configuration as the variable resistance nonvolatile memory device 100 described above. However, the variable resistance nonvolatile memory device 200 is different from the variable resistance nonvolatile memory device 100 in that the noble metal electrode layer 29 is formed flatly only on the bottom of the memory cell hole 20 and on the surface of the electrode seed layer 21.

Next, a manufacturing method according to the present embodiment will be described with reference to FIGS. 7(a) to (d) and FIGS. 8(a) to (c). It is to be noted that, in FIGS. 7(a) to (d) and FIGS. 8(a) to (c), the configuration of only an upper portion from the second interlayer insulating layer 16 is illustrated for simplification of the drawings.

FIGS. 7(a) to (d) are diagrams which show processes of (i) forming and stacking the electrode seed layer 21 on each of the lower layer copper lines 18 embedded in the second interlayer insulating layer 16 by damascene processing to be shaped into a strip, (ii) further forming the third interlayer insulating layer 19 on the second interlayer insulating layer 16 including the lower layer copper line 18 and the electrode seed layer 21, and (iii) forming the memory cell hole 20 to be connected to the electrode seed layer 21.

Figure 7A:
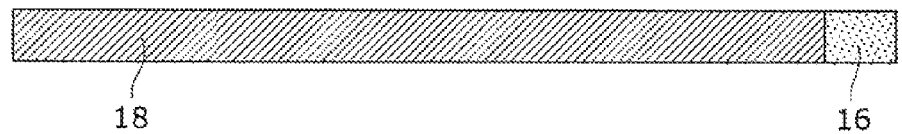
FIGS. 7(a) to (d) are diagrams showing processes of a method of manufacturing the variable resistance nonvolatile memory device according to Embodiment 1 of the present invention, from a process of forming an electrode seed layer on a lower layer copper line embedded in an interlayer insulating layer and further forming an interlayer insulating layer on the electrode seed layer to a process of forming a memory cell hole for connecting to the electrode seed layer at a predetermined position in the interlayer insulating layer.
Figure 7B:
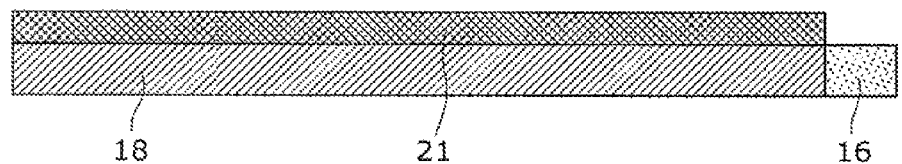

First, as shown in in FIG. 7(a), each of the lower layer copper lines 18 is formed into a strip in the second interlayer insulating layer 16, and then the electrode seed layer 21 is formed and stacked to be shaped into the strip which is the same shape as the lower layer copper line 18 only on the surface of a corresponding one of the lower layer copper lines 18, as shown in FIG. 7(b). The process described above is an example of steps of (A) and (B) according to the present invention.

In the present embodiment as well, the electrode seed layer 21 is formed by electroless plating in the same manner as the basic manufacturing method described above. In addition, it is preferable to use nickel-phosphorus alloy, nickel-boron alloy, or nickel for the electrode seed layer 21.

By using the electroless plating as described above, the electrode seed layer 21 is selectively formed only on the surface of the lower layer copper lines 18 embedded in the second interlayer insulating layer 16 by damascene processing, and the electrode seed layer 21 is not formed on the second interlayer insulating layer 16. Accordingly, the electrode seed layer 21 is formed on the lower layer copper line 18 in the same shape of the strip as the lower layer copper line 18.

In addition, since the electrode seed layer 21 is formed to cover the surface of the lower layer copper line 18, the electrode seed layer 21 serves also as a top cap layer that prevents copper from diffusing into the interlayer insulating layer after forming the interlayer insulating layer on the lower layer copper line 18 in the subsequent processing.

In addition, in the case where a metal material which shows catalytic property for the reducing agent of the noble metal electroless plating bath but which is difficult to form a film on copper by electroless plating, such as zinc (Zn), iron (Fe), and the like is to be used for the electrode seed layer, the electrode seed layer 21 may be shaped into a strip to stack on each of the lower layer copper line 18, by using sputtering film formation and patterning process using exposure process and etching.

Figure 7C:
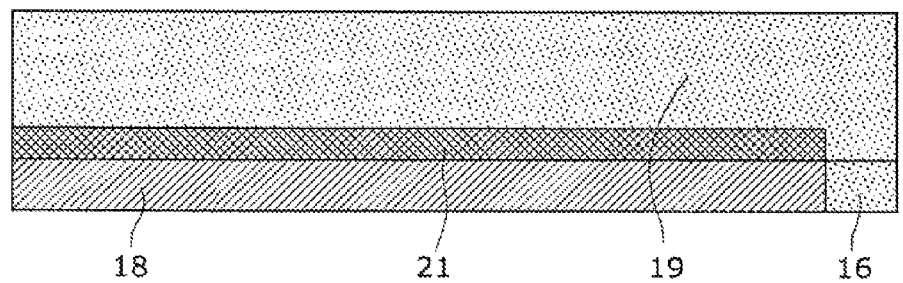
Figure 7D:
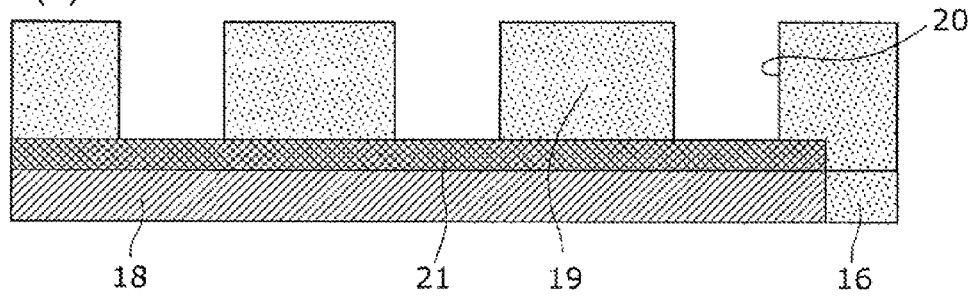
Figure 8A:
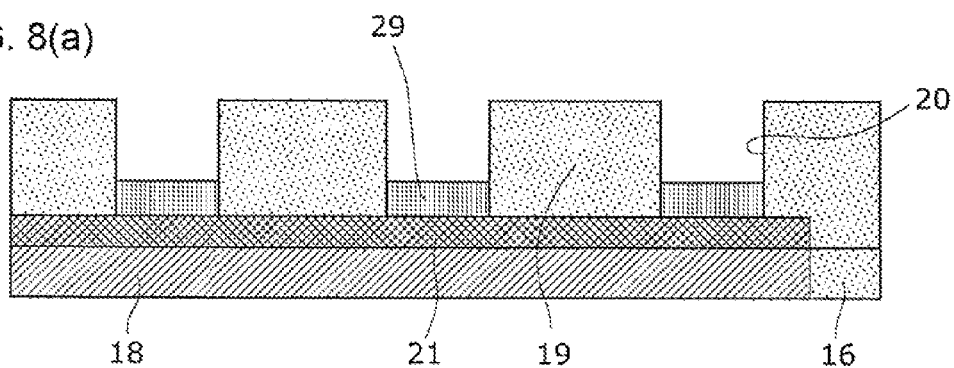
FIGS. 8(a) to (c) are diagrams showing processes of the method of manufacturing the variable resistance nonvolatile memory device according to Embodiment 1 of the present invention, from a process of forming a noble metal electrode at the bottom of the memory cell hole to a process of further embedding a variable resistance layer.
Figure 8B:
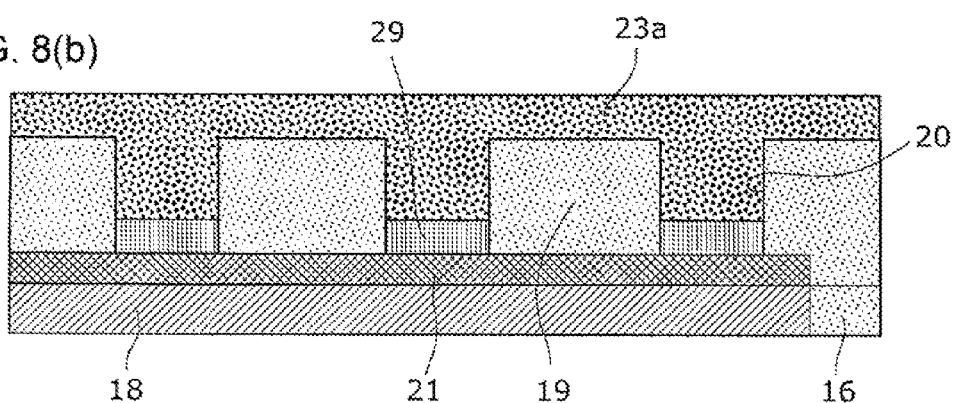
Figure 8C:
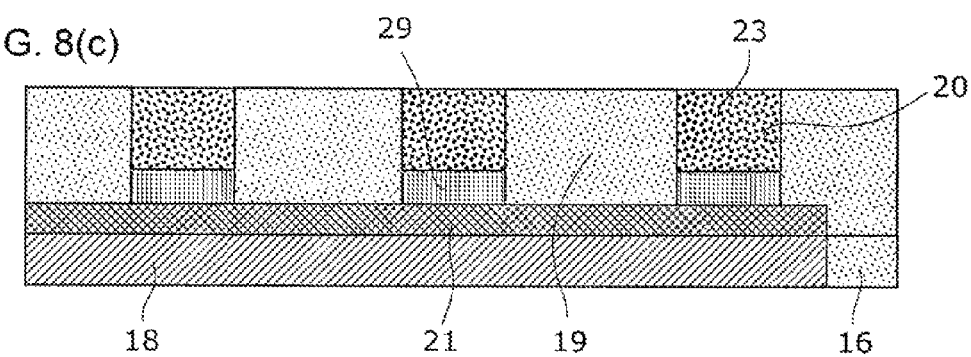

Next, in the process shown in FIG. 7(c), the third interlayer insulating layer 19 comprising TEOS-SiO and the like is formed by CVD. In this case as well, the third interlayer insulating layer 19 may have a stacking configuration having plural layers, by inserting SiN, SiON, SiCN, or the like which serves as an etching stopper layer on the lower layer of the third interlayer insulating layer 19 so as to facilitate the formation of the memory cell hole 20.

In addition, a SiON film, for example, which is harder in CMP than TEOS-SiO$_2$ may be formed on the upper layer of the third interlayer insulating layer 19. By forming the SiON film on the upper layer of the third interlayer insulating layer 19, it is possible to easily and reliably perform the subsequent CMP process when embedding the variable resistance layer 23 in the memory cell hole 20. The process described above is an example of a step (D2) according to the present invention.

Next, in the process shown in FIG. 7(*d*), memory cell holes 20 are formed which penetrate through the third interlayer insulating layer 19 to the surface of the electrode seed layer 21. Each of the memory cell holes 20 is formed at a constant arrangement pitch along the lengthwise direction of the lower layer copper line 18 and the electrode seed layer 21. The memory cell hole 20 has a shape smaller than the width of each of the lower layer copper line 18, the electrode seed layer 21, and the noble metal electrode layer 22 as in the shape of FIGS. 1(*a*) and (*b*). The process described above is an example of a step of (E2) according to the present invention.

FIGS. 8(*a*) to (*c*) are diagrams which show the processing form a process of forming the noble metal electrode layer 29 only on the bottom of the memory cell hole 20 using electroless plating to a process of embedding the variable resistance layer 23 in the memory cell hole 20.

First, in the process shown in FIG. 8(*a*), the noble metal electrode layer 29 that is flat is formed by electroless plating on the surface of the electrode seed layer 21 exposed to the bottom of the memory cell hole 20.

It is defined here that, when the noble metal electrode layer 29 is flat, the noble metal electrode layer 29 is formed only on the surface of the electrode seed layer 21 exposed to the bottom of the memory cell hole 20 evenly into a thinness within a range controllable by electroless plating, and not formed at a position higher than an upper limit of the range of the thickness, for example, not on the surface of the third interlayer insulating layer 19 that serves as a side wall of the memory cell hole 20. The range of the thickness is, for example, between 5 nm and 100 nm inclusive.

Platinum or palladium is used for the noble metal electrode layer 29. Hydrazidine, formate, hypophosphite, dimethylamine borane, or the like can be used as the reducing agent used in the electroless plating bath of noble metals, and it is preferable to use hydrazidine or formate each of which does not include an impurity in a plate film.

Since the oxidation reaction of the reducing agent included in the electroless plating bath occurs only on the electrode seed layer 21 exposed to the bottom of the memory cell hole 20 and a positive ion including a noble metal in the plating bath is reduced and precipitates, a noble metal plate film selectively precipitates only on the electrode seed layer 21. Accordingly, the noble metal plate film is not formed on the surface of the third interlayer insulating layer 19 which serves as the side wall of the memory cell hole 20.

Therefore, a leak between upper and lower lines due to an electrode material, which can occur when the electrode material is formed on the surface of the third interlayer insulating layer 19 that serves as the side wall of the memory cell hole 20, can be avoided by using electroless plating.

In addition, since the noble metal electrode is formed only on the bottom of the memory cell hole 20 and not formed on the interlayer insulating layer, it is not necessary to perform the process of removing the electrode material formed on the interlayer insulating layer by CMP or etch back. In particular, since the noble metal material is low in reactivity, it is difficult to remove by CMP. Therefore, the use of electroless plating eliminates the need for damascene processing by CMP, thereby allowing a decrease in man-hour. Furthermore, film formation is performed only on the bottom of the memory cell hole and not performed on an unnecessary portion, thereby allowing reduction in the amount of the noble metal use, and thus it excels in cost performance as well. The process described above is an example of a step (C2) according to the present invention.

Next, in the process shown in FIG. 8(*b*), a resistant thin film layer 23*a* that will be formed into the variable resistance layer 23 is formed above the third interlayer insulating layer 19 including the memory cell hole 20. The variable resistance layer 23 is formed by sputtering oxygen-deficient tantalum oxide (TaO$_x$), for example. It is to be noted that, as a film formation method, CVD, ALD, and the like may be used in addition to sputtering.

Next, in the process shown in FIG. 8(*c*), the resistant thin film layer 23*a* on the third interlayer insulating layer 19 is removed using the CMP process. As described above, the variable resistance layer 23 is embedded in the memory cell hole 20 such that the variable resistance layer 23 is connected to the noble metal electrode layer 29. It is to be noted that the method of removing the resistant thin film layer 23*a* is not limited to CMP but etch back may also be used. The process described above is an example of a step (F) according to the present invention.

Subsequent to FIG. 8(*c*), the fourth interlayer insulating layer 26 is formed on the variable resistance layer 23 and the third interlayer insulating layer 19 using the processes same as those in the manufacturing method shown in FIGS. 5(*a*) to (*c*) described above, and the upper layer copper line 24 is formed on the third interlayer insulating layer 19 to be connected to the variable resistance layer 23. The process described above is an example of a step (G) according to the present invention.

In addition, the electroless plating using the plating bath including a reducing agent is used to form the noble metal electrode layer in Embodiment 1 of the present invention. However, displacement plating (immersion plating) that utilizes the difference in ionization tendency may be used.

When a work-piece is put into a plating bath including an ion of a metal having a small ionization tendency and the work-piece comprises a metal that has an ionization tendency larger than the metal having a small ionization tendency, the surface of the work-piece is dissolved into the plating bath and ionized, and then emits an electron, when the plating bath has a property of dissolving the work-piece. Then, on the surface of the work-piece, due to the exchange of electrons emitted then, the metal ion in the plating bath becomes a metal and precipitates on the surface of the work-piece.

Here, since standard electrode potentials of metal elements included in the platinum group are +1.188 V for platinum and +0.915 V for palladium and the metal elements have the small ionization tendencies following gold, the metal elements easily precipitate in displacement precipitation and reduction precipitation. In addition, platinum chloride solution or palladium chloride solution may be used for the immersion plating of a noble metal.

For the electrode seed layer when the noble metal electrode layer is formed by displacement plating, a metal that shows ionization tendency larger than a noble metal, such as aluminum (Al), zinc, iron, nickel, in (Sn), or lead (Pb) may be used.

In addition, since reaction stops at the point when a work-piece is coated by plate film in the displacement plating, a thin noble metal can be obtained. In addition, since a pinhole is likely to be produced in the plate film formed by the displacement plating, sealing processing involving immersion into an ammonia solution, for example, is performed to fill the pinhole and improve corrosion resistance.

Embodiment 2

Figure 9:
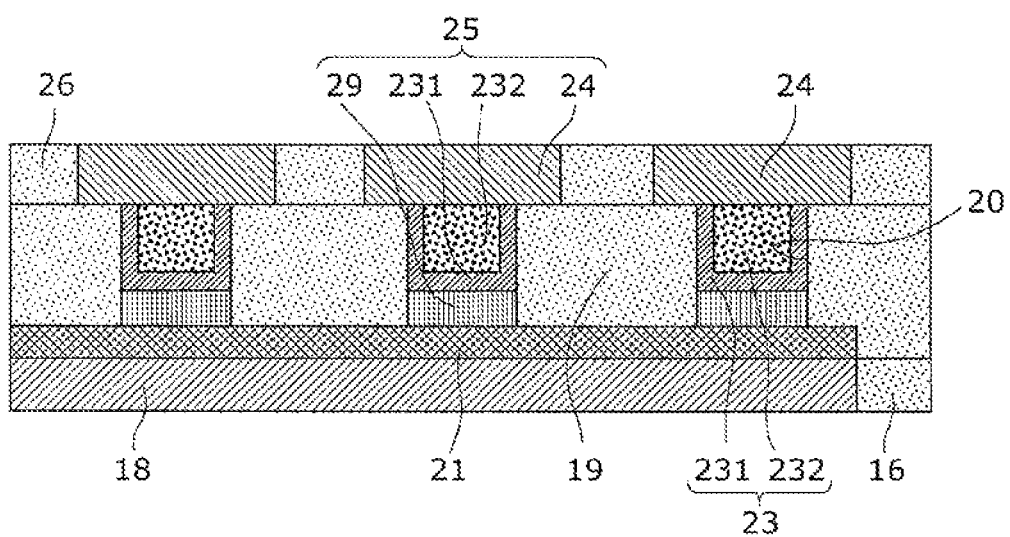
FIG. 9 is a cross-sectional view of a main section for showing a configuration of a variable resistance element of the variable resistance nonvolatile memory device according to Embodiment 2 of the present invention.
Figure 10A:
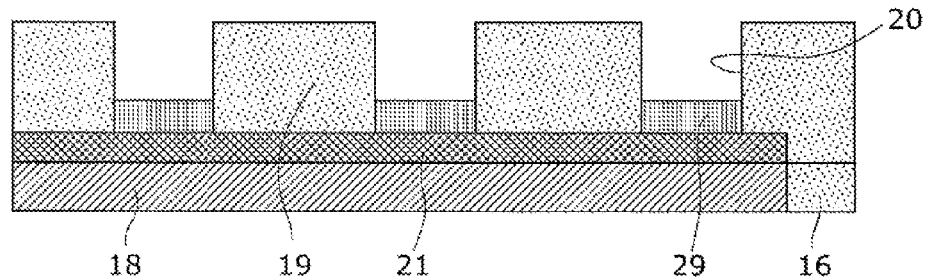
FIGS. 10(a) to (d) are diagrams showing processes of a method of manufacturing the variable resistance nonvolatile memory device according to Embodiment 2 of the present invention, from the state of which an electrode seed layer, an interlayer insulating layer, a memory cell hole, and a noble metal electrode layer are formed above a lower layer copper line to a process of embedding a variable resistance layer having a configuration of stacked two layers having oxygen content atomic percentages different from each other in an upper section of the memory cell hole.
Figure 10B:
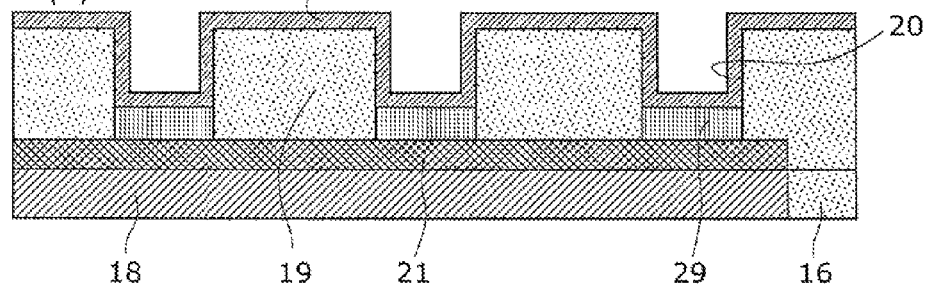
Figure 10C:
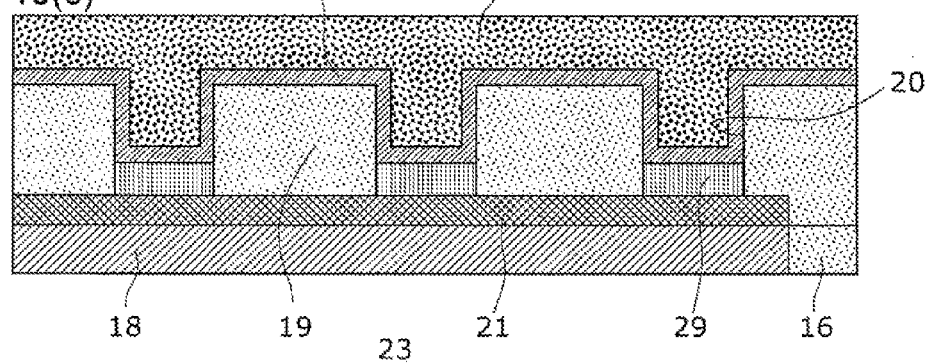
Figure 10D:
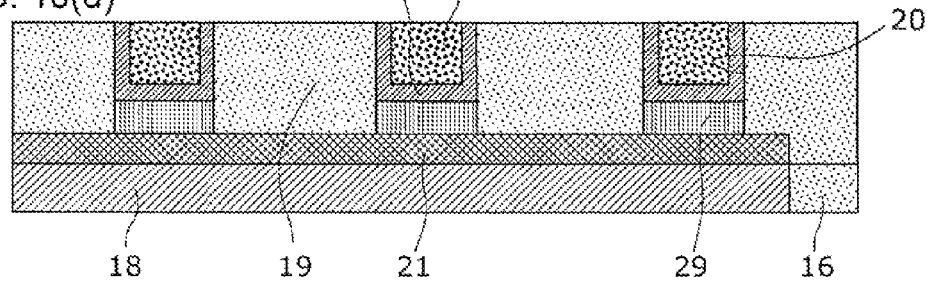

FIG. 9 is a diagram explaining a configuration of a variable resistance nonvolatile memory device 300 according to Embodiment 2 of the present invention, and a cross-sectional view of an enlarged main section for showing a configuration of the variable resistance element 25.

The variable resistance nonvolatile memory device 300 according to the present embodiment has the same basic configuration as the variable resistance nonvolatile memory device 200 according to Embodiment 1. The variable resistance nonvolatile memory device 300 differs from the variable resistance nonvolatile memory device 200 in that the variable resistance layer 23 embedded in the memory cell hole has a stacking configuration including a first variable resistance layer 231 formed to connect to the noble metal electrode layer 29 and a second variable resistance layer 232 formed on the first variable resistance layer 231, the first variable resistance layer 231 and the second variable resistance layer 232 are metal oxides of the same type, and the oxygen content atomic percentage of the first variable resistance layer 231 is higher than the oxygen content atomic percentage of the second variable resistance layer 232.

With the configuration described above, it is possible to reliably cause a resistance change in an interfacial surface region between the first variable resistance layer 231 and the noble metal electrode layer 29, by placing the first variable resistance layer 231 which connects to the noble metal electrode layer 29 and has a high oxygen content atomic percentage at the bottom of the memory cell hole 20 and placing the second variable resistance layer 232 which has a low oxygen content atomic percentage on the first variable resistance layer 231. As a result, the polarity of electric pulses to be applied for causing a resistance change (change to high resistance state or to low resistance state) in the variable resistance layer 23 is uniquely determined, and thus it is possible to obtain stable operation characteristics as a memory device. This is because that, since the resistance change is caused by an oxidation-reduction reaction near an electrode of the variable resistance layer 23, the first variable resistance layer 231 having oxygen that can contribute to oxidation reduction is placed near the interfacial surface between the variable resistance layer 23 and the noble metal electrode layer 29, thereby allowing stable resistance change. It is to be noted that the first variable resistance layer 231 is formed on the side wall of the memory cell hole 20 as well in FIG. 9; however, it is sufficient to be formed at least on a portion contacting with the noble metal electrode layer 29 (the bottom of the memory cell hole 20).

Next, a manufacturing method according to the present embodiment will be described with reference to FIGS. 10(*a*) to (*d*). It is to be noted that, in FIGS. 10(*a*) to (*d*), the configuration of only an upper portion from the second interlayer insulating layer 16 is illustrated for simplification of the drawings. In addition, as shown in FIG. 10(*a*), the following describes the processes subsequent to the forming of the noble metal electrode layer 29 only at the bottom of the memory cell hole 20 in the third interlayer insulating layer 19 through the electroless plating, using the manufacturing method explained in the description for the variable resistance nonvolatile memory device 200 according to Embodiment 1 of the present invention.

First, as shown in FIG. 10(*b*), a first resistant thin film layer 231*a* that will be formed into the first variable resistance layer is formed above the third interlayer insulating layer 19 including the memory cell hole 20. Oxygen-deficient tantalum oxide ($TaO_x$) is used for the variable resistance layer and the reactive sputtering method with which a tantalum target is sputtered in oxygen gas atmosphere is used for forming the first resistant thin film layer 231*a* in the present embodiment as well. It is preferable that the oxygen content atomic percentage is from 65 to 75 atm %, the resistivity is at least $10^7$ mΩcm, and the thickness is from 3 to 10 nm. In the example presented here, the reactive sputtering is used for the forming of the first resistant thin film layer 231*a*; however, it is also possible to oxidize the surface layer by plasma oxidation processing to form a transition metal oxide layer having a high oxygen content atomic percentage. It is difficult to cause oxygen to be contained more than or as much as stoichiometric composition with the sputtering. However, since oxygen is filled into a grain boundary or a flow of the tantalum oxide by performing the plasma oxidation processing, it is possible to form a transition metal oxide layer having a higher oxygen content atomic percentage, and thus it is effective to prevent leak current. In addition, a reactive sputtering method with which the tantalum oxide target is sputtered in the oxygen gas atmosphere may be used as well.

In addition, it is also possible to use the electroless plating for forming the first variable resistance layer 231 in the memory cell hole 20. More specifically, a metal thin film layer (tantalum in this case) is formed using the electroless plating so as to selectively grow only on the noble metal electrode layer 29 formed at the bottom of the memory cell hole 20.

When the electroless plating is used, unlike FIG. 10(*b*), the metal thin film layer is selectively precipitated only on the noble metal electrode layer 29, and not on the surface of the interlayer insulating layer 19 which serves as the side wall of the memory cell hole 20 and on the surface of the interlayer insulating layer 19 outside the memory cell hole 20.

The tantalum thin film layer is oxidized in an oxygen atmosphere (from 400 to 450 degrees Celsius) to form the first variable resistance layer 231 comprising the tantalum oxide. At this time, tantalum is completely oxidized, and thus the oxygen content atomic percentage is approximately 71 atm % that is close to the stoichiometric composition of $Ta_2O_5$. It is to be noted that it is preferable, in this process, to use thermal oxidation that is highly efficient in complete oxidation of a metal into a metal oxide. The process described above is an example of a step (F1) according to the present invention.

Next, as shown in FIG. 10(*c*), a second resistant thin film layer 232*a* that will be formed into a second variable resistance layer having an oxygen content atomic percentage lower than the oxygen content atomic percentage of the first resistant thin film layer 231*a* is formed and stacked on the first resistant thin film layer 231*a*. In forming the second resistant thin film layer 232*a*, the oxygen-deficient tantalum oxide is filled into the memory cell hole 20 until the memory cell hole 20 is completely filled, through the reactive sputtering method in the same manner as in the first resistant thin film layer 321*a*. The oxygen content atomic percentage is from 50 to 65 atm % and the resistivity is from 2 to 50 mΩcm. The process described above is an example of a step (F2) according to the present invention.

Next, as shown in FIG. 10(*d*), the first resistant thin film layer 231*a* and the second resistant thin film layer 232*a* above the third interlayer insulating layer 19 are removed using the CMP process. As described above, the variable resistance layer 23 having a stacking configuration of the first variable resistance layer 231 and the second variable resistance layer 232 is embedded into the memory cell hole 20 such that the variable resistance layer 23 is connected to the noble metal electrode layer 29. It is to be noted that the method of removing the resistant thin film layer is not limited to CMP but etch back may also be used.

Then, the fourth interlayer insulating layer 26 is formed above the variable resistance layer 23 and the third interlayer insulating layer 19 in the same manner as the manufacturing method according to other embodiments of the present invention, and the upper layer copper line 24 is formed in the fourth interlayer insulating layer 26 such that the upper layer copper line 24 is connected to the variable resistance layer 23, thereby enabling manufacturing of the variable resistance nonvolatile memory device 300 according to the present embodiment.

Embodiment 3

Figure 11A:
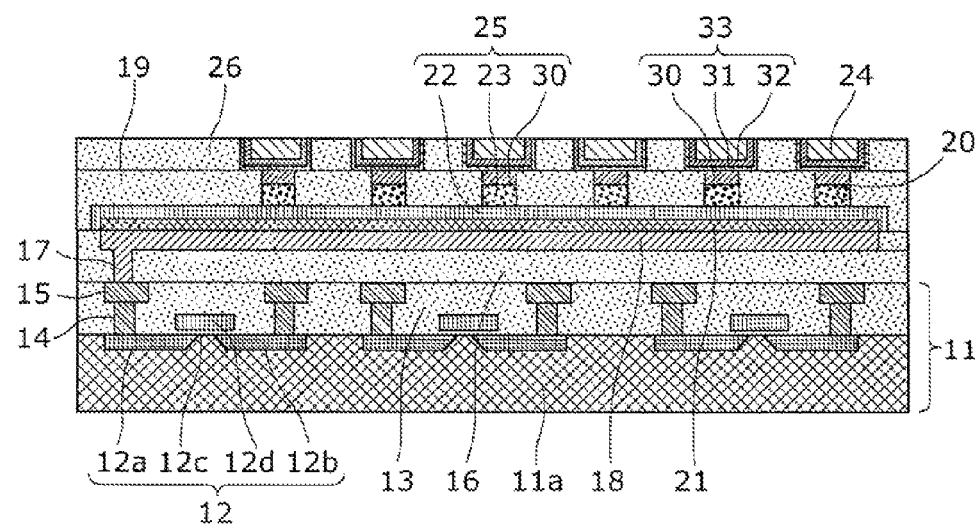
FIG. 11(a) is a cross-sectional diagram for explaining a configuration of a variable resistance nonvolatile memory device according to Embodiment 3 of the present invention.
Figure 11B:
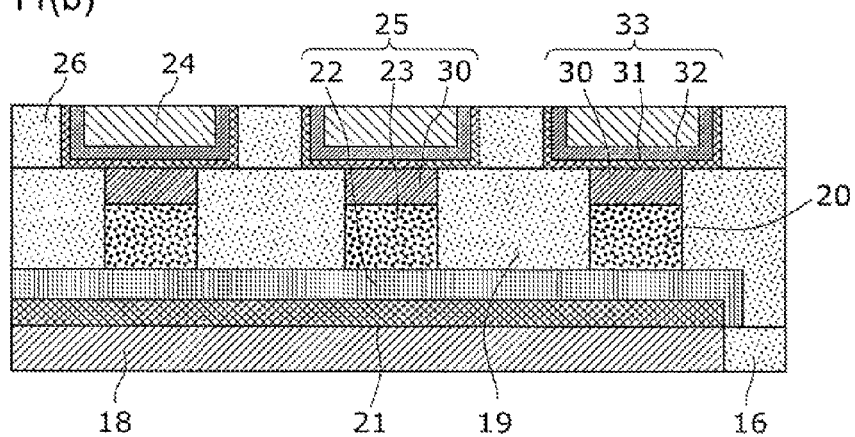
FIG. 11(b) is a cross-sectional view of a main section for showing a configuration of a variable resistance element and a diode element of the variable resistance nonvolatile memory device according to Embodiment 4 of the present invention.

FIGS. 11(a) and (b) are diagrams explaining a configuration of a variable resistance nonvolatile memory device 400 according to Embodiment 3 of the present invention, and FIG. 11(a) is a cross-sectional view and FIG. 11(b) is a cross-sectional view of an enlarged main section for showing a configuration of the variable resistance element 25 and a diode element 33.

The variable resistance nonvolatile memory device 400 according to the present embodiment has the same basic configuration as the variable resistance nonvolatile memory device 100 described above. However, the variable resistance nonvolatile memory device 400 is different from the variable resistance nonvolatile memory device 100 in that the diode element 33 connected to the variable resistance element 25 in series is included.

More specifically, the electrode seed layer 21 and the noble metal electrode layer 22 are formed and stacked in this order on each of the lower layer copper lines 18 by the electroless plating, and the variable resistance layer 23 and an intermediate electrode layer 30 formed and stacked in this order in the memory cell hole 20. The variable resistance element 25 is made up of the noble metal electrode layer 22, the variable resistance layer 23, and the intermediate electrode layer 30.

The noble metal electrode layer 22 and the variable resistance layer 23 are made of the materials same as those used for the noble metal electrode layer 22 and the variable resistance layer 23 of the variable resistance nonvolatile memory device 100.

The metal-semiconductor-metal diode (MSM Diode) is used in this case for the diode element 33 The MSM diode has a characteristic of being able to bi-directionally (both of a positive voltage polarity and a negative voltage polarity) turn a current ON or OFF, and a characteristic of allowing a large current necessary during a resistance change to flow. TaN, TiN, or W may be used for the intermediate electrode layer 30 comprised by the diode element 33. The intermediate electrode layer 30 serves also as a lower electrode of the diode element 33, and these materials meet the conditions required as electrode materials for the variable resistance element.

The fourth interlayer insulating layer 26 formed on the third interlayer insulating layer 19 includes a line groove formed therein. The semiconductor layer 31, the upper electrode 32, and the upper layer copper line 24 are stacked in this order and embedded in the line groove. The MSM diode that is an example of the diode element 31 is made up of the intermediate electrode layer 30, the semiconductor layer 31, and the upper electrode 32.

Other than the MSM diode having the stacking configuration of three layers of the semiconductor layer 31, and the intermediate electrode layer 30 and the upper electrode 32 between which the semiconductor layer 31 is disposed, an element having a nonlinear switching characteristic, such as an MIM diode having the stacking configuration of three layers of an insulating layer and metal electrode assembly layers between which the insulating layer is disposed, a pn junction diode having the stacking configuration of two layers of a p-type semiconductor and an n-type semiconductor, a Schottky diode having the stacking configuration of two layers of a semiconductor layer and a metal electrode assembly layer, or the like may be used as the diode element 33 according to the variable resistance characteristic of the variable resistance element 25.

As described above, the variable resistance nonvolatile memory device 400 includes the diode element 33 added to the variable resistance nonvolatile memory device 100.

By inserting the diode element 33 in series with respect to the variable resistance layer 23, it is possible to reduce crosstalk when reading or writing a resistance value of the variable resistance layer 23 formed at a crosspoint of the lower layer copper line 18 (bit line, for example) and the upper layer copper line 24 (word line, for example) in the variable resistance nonvolatile memory device 400.

It is to be noted that, in order to obtain the advantageous effects described above, a modification example can be considered which includes the diode element 33 added to the variable resistance nonvolatile memory device 200 or the variable resistance nonvolatile memory device 300 described in Embodiments 1 or 2. Similar advantageous effects can be obtained by a variable resistance nonvolatile memory device (not illustrated) in which the diode element 33 and the variable resistance nonvolatile memory device 200 or 300 are combined.

Next, a method of manufacturing the variable resistance nonvolatile memory device 400 according to the present embodiment will be described with reference to FIGS. 12(a) to (c), FIGS. 13(a) to (c), and in FIGS. 14(a) and (b). It is to be noted that, in FIGS. 12(a) to (c), FIGS. 13(a) to (c), and FIGS. 14(a) and (b), the configuration of only an upper portion from the second interlayer insulating layer 16 including the lower layer copper line 18 is illustrated for simplification of the drawings.

Figure 12A:
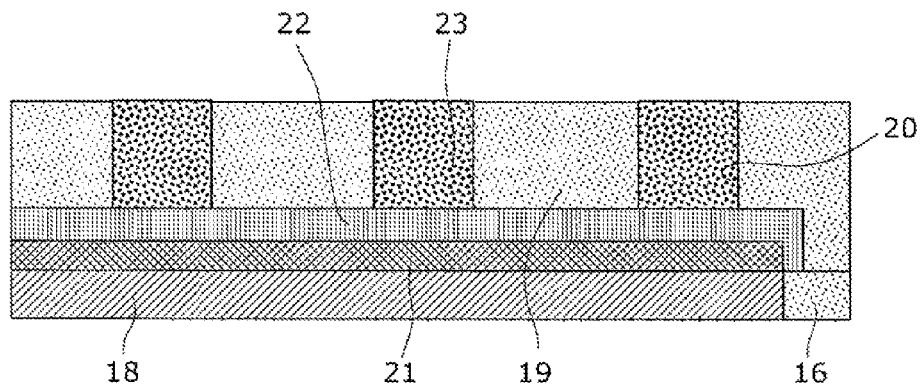
FIGS. 12(a) to (c) are diagrams showing processes of the method of manufacturing a variable resistance nonvolatile memory device according to Embodiment 3 of the present invention, from a process of forming and stacking, above a lower layer copper line, an electrode seed layer and a noble metal electrode layer, and further forming an interlayer insulating layer and a memory cell hole on the noble metal electrode layer, to a process of forming an electrode thin film layer to be an intermediate electrode layer on an upper side of the memory cell hole by removing a part of an upper section of the variable resistance layer from the state of which the memory cell hole is filled with the variable resistance layer.

The following describes the processes subsequent to the embedding of the variable resistance layer 23 in the memory cell hole 20 to be connected to the noble metal electrode layer 22, using the manufacturing method explained in the description for the variable resistance nonvolatile memory device 100, as shown in FIG. 12(a).

Figure 12B:
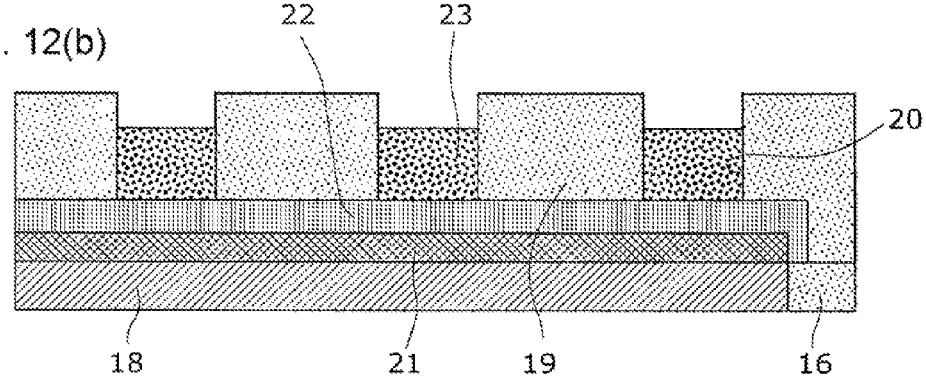
Figure 12C:
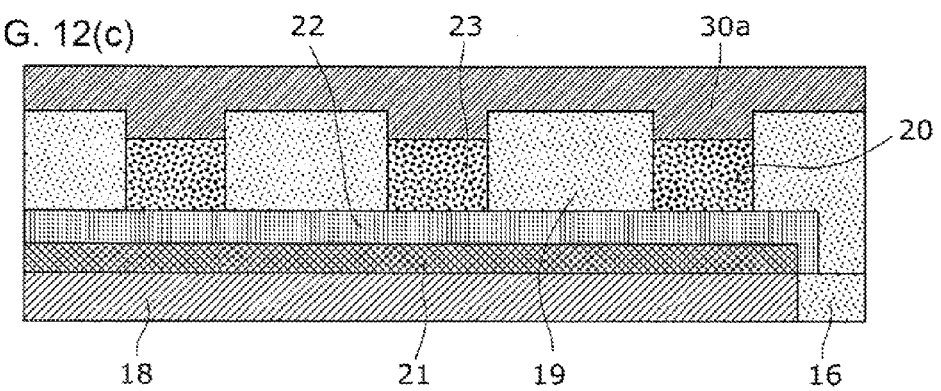

FIGS. 12(a) to (c) are diagrams showing processes from a process of forming a recess on the surface of the variable resistance layer 23 embedded in the memory cell hole 20 to a process of forming, in the recess, a metal thin film layer 30a that will be formed into the intermediate electrode layer 30 that serves as a lower electrode of the diode element 33.

First, as shown in FIG. 12(b), overpolish is performed when embedding the variable resistance layer 23 in the memory cell hole 20 by CMP to remove only part of the variable resistance layer 23 in the side of the surface in the memory cell hole 20, using the difference in polishing rate between the variable resistance layer 23 and the third interlayer insulating layer 19. It is to be noted that the method of removing part of the variable resistance layer 23 is not limited to CMP but etch back may also be used.

In the process shown in FIG. 12(c), the metal thin film layer 30a that will be formed into the intermediate electrode layer 30 that serves as an upper electrode of the variable resistance element 25 and a lower electrode of the diode element 33 is formed above the third interlayer insulating layer 19 including the memory cell hole 20. In the present embodiment, a film comprising tantalum nitride (TaN), titanium nitride (TiN), or tungsten (W) is formed as the metal thin film layer 30a by sputtering.

Figure 13A:
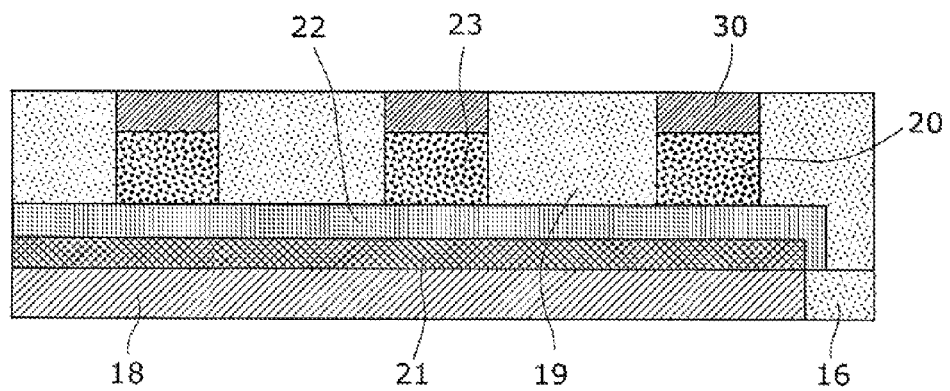
FIGS. 13(a) to (c) are diagrams showing processes of the method of manufacturing the variable resistance nonvolatile memory device according to Embodiment 3 of the present invention, from a process of embedding an intermediate electrode layer and further forming an interlayer insulating layer on an interlayer insulating layer including the intermediate electrode layer to a process of forming a line groove for connecting to the intermediate electrode layer and embedding a diode element and an upper layer copper line.
Figure 13B:
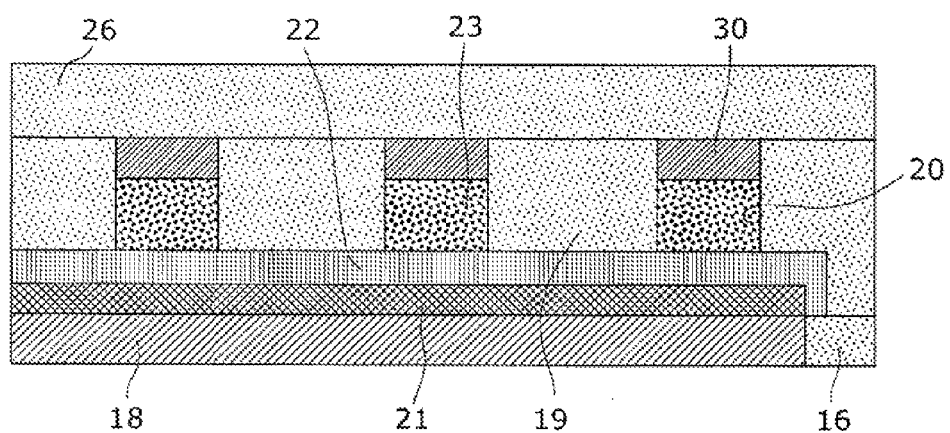
Figure 13C:
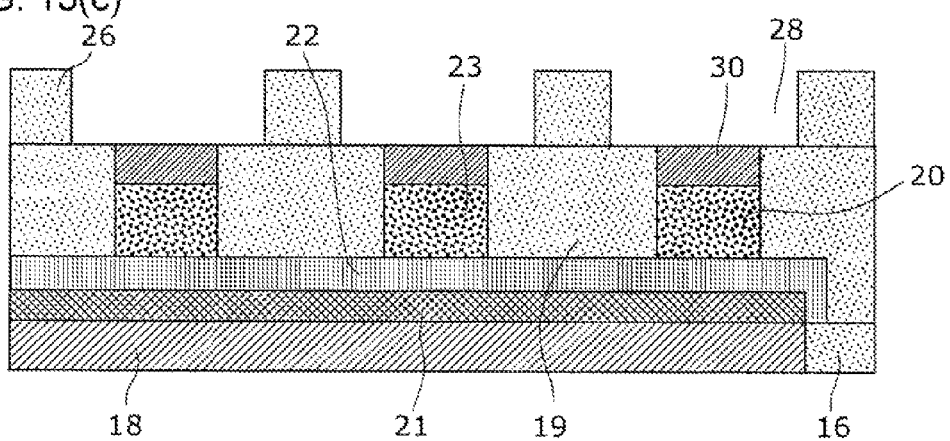

FIGS. 13(a) to (c) are diagrams which show processes from a process of removing the thin film layer 30a above the third interlayer insulating layer 19 and embedding the intermediate electrode layer 30 in an upper section of the memory cell hole 20 to a process of further forming the fourth interlayer insulating layer 26 above the intermediate electrode layer 30 and forming a line groove 28 for connecting the intermediate electrode layer 30 and embedding the diode element 33 in the fourth interlayer insulating layer 26.

As shown in FIG. 13(a), the metal thin film layer 30a above the third interlayer insulating layer 19 is removed using CMP processing and embeds the intermediate electrode layer 30 in the memory cell hole Next, as shown in FIG. 13(b), the fourth interlayer insulating layer 26 is further formed above the intermediate electrode layer 30 and the third interlayer insulating layer 19 using CVD or the like.

Next, in the process shown in FIG. 13(c), the line groove 28 is formed in the fourth interlayer insulating layer 26, for embedding the semiconductor layer 31 and the upper electrode 32 which are included in the diode element 33 and further the upper layer copper line 24. In the present embodiment, the line groove 28 is shaped into a strip crossing the lower layer copper line 18 so that the semiconductor layer 31, the upper electrode 32, and the upper layer copper line 24 are shaped into the strips crossing the lower layer copper line 18. In addition, the line groove 28 can be easily formed using the techniques used in a general semiconductor processing.

Figure 14A:
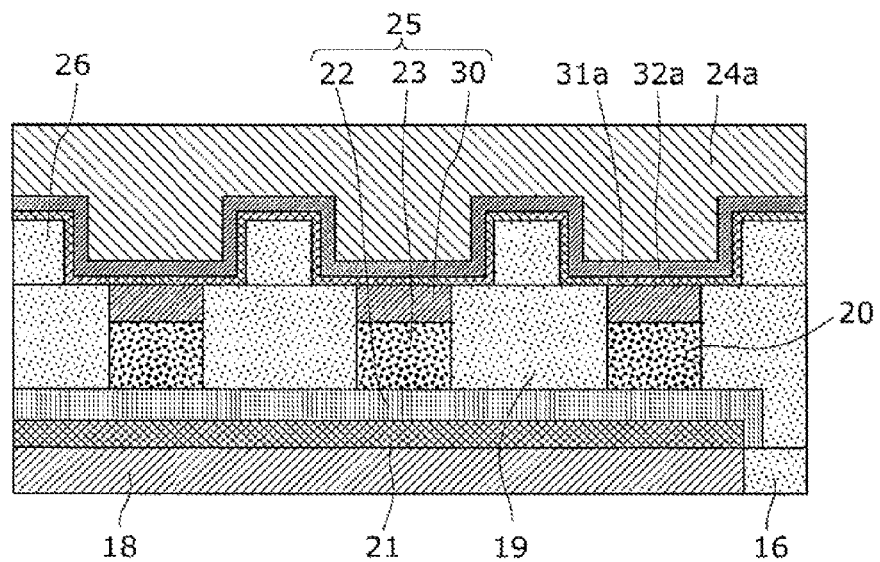
FIGS. 14(a) and (b) are diagrams showing processes of the method of manufacturing the variable resistance nonvolatile memory device according to Embodiment 3 of the present invention, from a process of embedding a diode element and an upper layer copper line in the line groove of the interlayer insulating layer.

FIGS. 14(a) and (b) are diagrams showing processes from a process of embedding the semiconductor layer 31 and the upper electrode 32 which are to be included in the diode element 33 and further the upper layer copper line 24 in the line groove formed in the fourth interlayer insulating layer 26.

In the process shown in FIG. 14(a), the semiconductor thin film layer 31a that will be formed into the semiconductor layer 31 of the diode element 33 and the metal thin film layer 32a that will be formed into the upper electrode 32 are formed and stacked above the fourth interlayer insulating layer 26 including the line groove 28. The process described above is an example of the process (G) of the present invention. Then, the copper thin film layer 24a that will be formed into the upper layer copper line 24 is further formed and stacked.

In addition, in the present embodiment, an MSM diode is made up of the semiconductor layer 31, and the intermediate electrode layer 30 and the upper electrode 32 between which the semiconductor layer 31 is interposed, using nitrogen-deficient silicon nitride ($SiN_y$) as a material for the semiconductor layer 31 and tantalum nitride, titanium nitride, or tungsten as a material for the upper electrode 32. It is to be noted that a $SiN_y$ film having such semiconductor characteristics can be formed by reactive sputtering in a nitrogen gas atmosphere using, for example, a Si target. For example, in the manufacturing, the pressure of a chamber may be from 0.1 Pa to 1 Pa in ambient conditions and $N_2$ flows with respect to Ar flows may be adjusted.

In the case where $SiN_y$ (y=0.3) having semiconductor characteristics is manufactured under the above-described conditions and to have a thickness of 10 nm, a current density of $5 \times 10^4$ A/cm$^2$ is obtained with voltage application of 2.0 V and a current density of $1 \times 10^3$ A/cm$^2$ is obtained with voltage application of 1.0 V Therefore, when these voltages are used as criteria, the current density ratio between ON/OFF is at least 10, showing that $SiN_y$ is sufficiently usable as a diode element of the variable resistance nonvolatile memory device.

In addition, as the upper layer copper line 24, a material same as the material of the lower layer copper line 18 can be used.

Figure 14B:
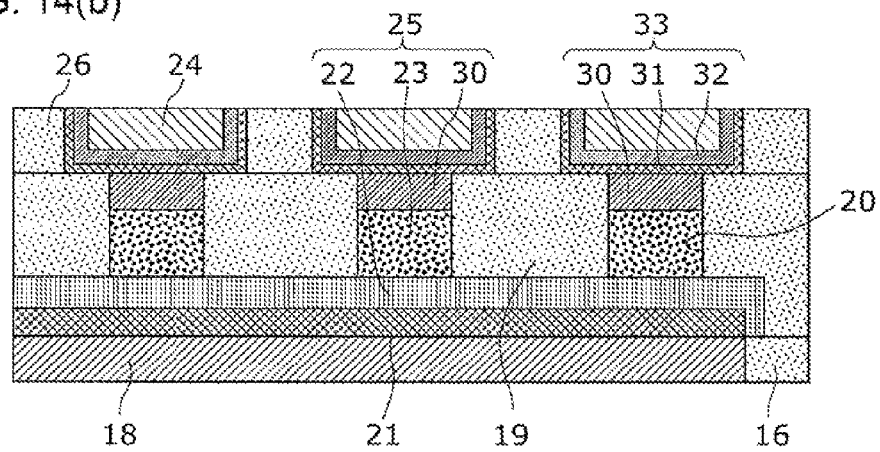

Next, in the process shown in FIG. 14(b), the semiconductor thin film layer 31a, the metal thin film layer 32a, and the copper thin film layer 24a above the fourth interlayer insulating layer 26 are removed by CMP, thereby embedding the semiconductor layer 31 and the upper electrode 32 of the diode element 33 and the upper layer copper line 24 in the line groove 28. The upper layer copper line 24 is electrically connected to the variable resistance layer 23 via the upper electrode 32, the semiconductor layer 31, and the intermediate electrode layer Through the above-described processes, the variable resistance element 25 is made up of the noble metal electrode layer 22, the variable resistance layer 23, and the intermediate electrode layer 30, and the diode element 33 is made up of the intermediate electrode layer 30, the semiconductor layer 31, and the upper electrode 32. With this, it is possible to manufacture the variable resistance nonvolatile memory device 40 according to the manufacturing method of the present embodiment.

It is to be noted that the processing to form the diode element may be carried out following the manufacturing process of the variable resistance nonvolatile memory device 200, or may be carried out following the manufacturing process of the variable resistance nonvolatile memory device 300.

With the above-described manufacturing method, it is possible to manufacture a variable resistance nonvolatile memory device formed by adding the diode element 33 to the variable resistance nonvolatile memory device 200 or the variable resistance nonvolatile memory device 300; that is, a variable resistance nonvolatile memory device in which the characteristic configuration that the noble metal electrode layer 29 is formed only in the memory cell hole 20 is combined with the diode element.

In the present embodiment, in order to form a lower electrode suitable to the diode, an example of forming the intermediate electrode layer 30 above the variable resistance layer 23 in the memory cell hole; however, the semiconductor layer 31 may be formed directly above the variable resistance layer 23 depending on the combination of the material of the variable resistance layer 23 and the material of the semiconductor layer 31.

In addition, the MSM diode is used as the diode element in the present embodiment; however, other diodes may be formed, such as the MIM diode having the stacking configuration of three layers of the insulating layer and the metal electrode assembly layers between which the insulating layer is disposed, the pn junction diode having the stacking configuration of two layers of the p-type semiconductor and the n-type semiconductor, and the Schottky diode having the stacking configuration of two layers of the semiconductor layer and the metal electrode assembly layer.

Embodiment 4

Figure 15:
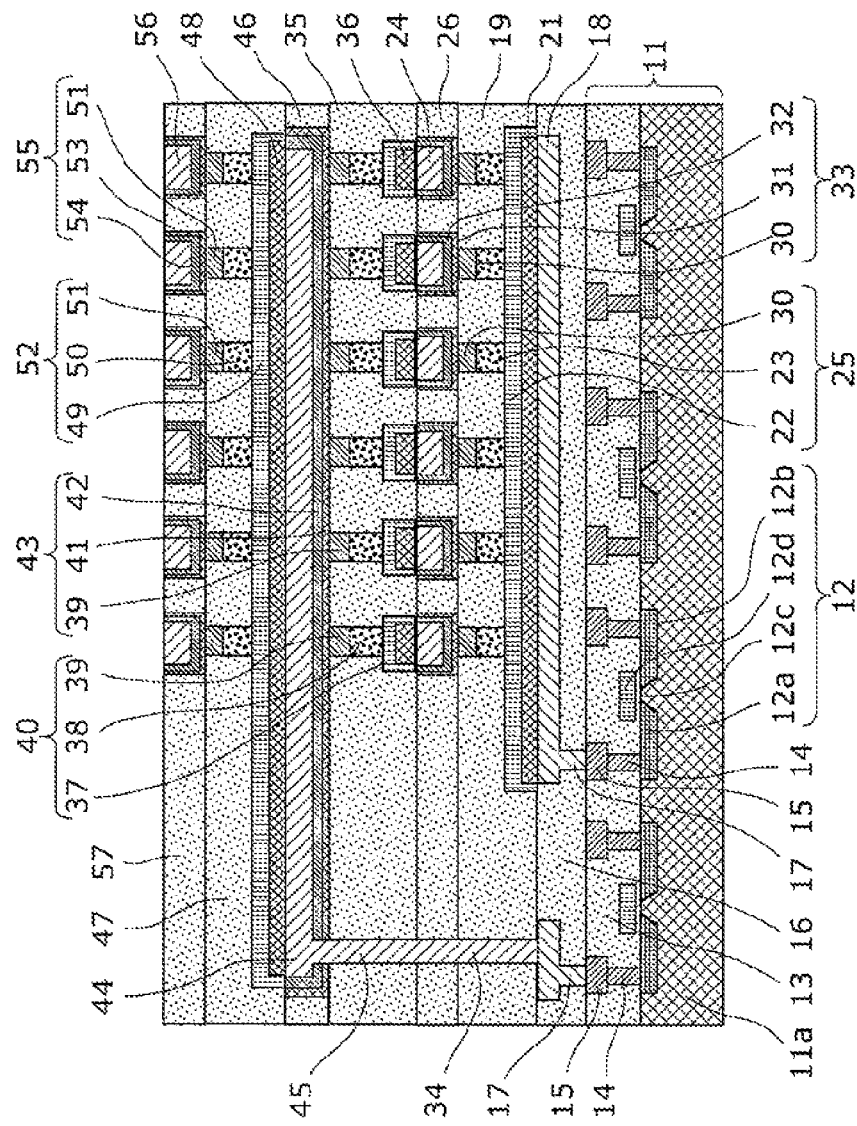
FIG. 15 is a cross-sectional diagram for explaining a configuration of a variable resistance nonvolatile memory device according to Embodiment 4 of the present invention.
Figure 16A:
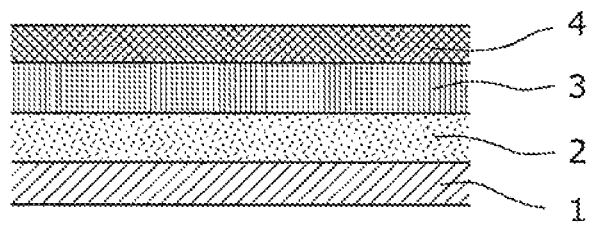
FIGS. 16(a) to (c) are cross-sectional diagrams showing main processes of the method of manufacturing a conventional variable resistance memory element.
Figure 16B:
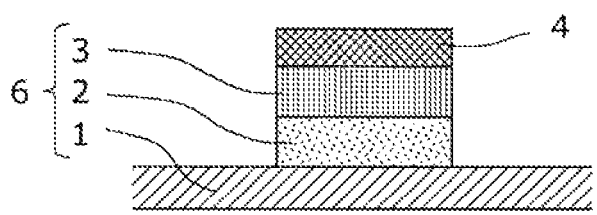
Figure 16C:
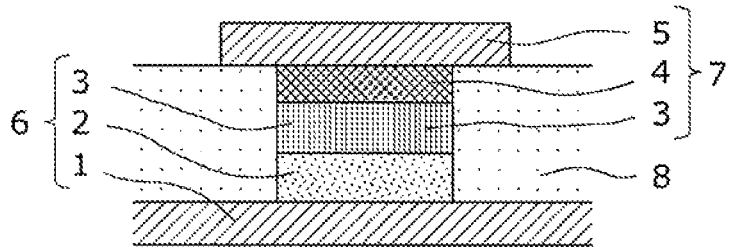
Figure 17:
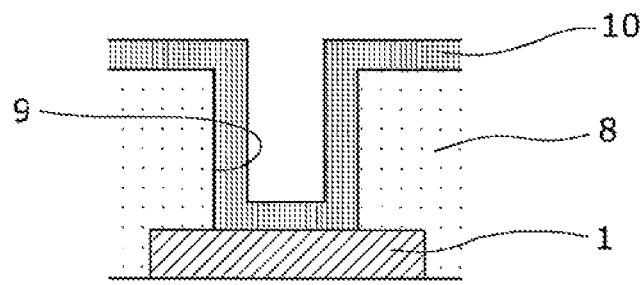
FIG. 17 is a cross-sectional view showing a main process of the method of manufacturing a conventional variable resistance memory element.

FIG. 15 is a cross-sectional diagram showing a configuration of a variable resistance nonvolatile memory device 500 according to Embodiment 4 of the present invention. The variable resistance nonvolatile memory device 500 has a basic configuration that is the configuration of the variable resistance nonvolatile memory device 400 according to Embodiment 3 shown in FIG. 11(a), and two structural units each of which includes as an electrode seed layer, a variable resistance element, a diode element, and an upper layer copper line are further stacked above the basic configuration. By stacking as described above, it is possible to implement a variable resistance nonvolatile memory device having a larger capacity.

The following describes a configuration of the variable resistance nonvolatile memory device 500 according to the present embodiment. It is to be noted that, since the variable resistance nonvolatile memory device 500 includes the variable resistance elements stacked in three stages and the diode elements stacked in three stages, in order to make it easier to understand the configuration of each of the first, second, and third stages, the term "first" is added to the elements in the first stage, the term "second" is added to the elements in the second stage, and the term "third" is added to the elements in the third stage, at the top of a name of each of the elements to denote the elements of the respective stages distinctively from one another.

The second electrode seed layer 36 is formed, above the first upper layer copper line 24, into a strip that is the same strip as the first upper layer copper line 24. In addition, the fifth interlayer insulating layer 35 is formed above the second electrode seed layer 36. In the fifth interlayer insulating layer 35, a memory cell hole is provided at the position corresponding to each of the variable resistance elements in the first stage including the first variable resistance element 25, and the second noble metal electrode layer 37, the second variable resistance layer 38, and the second intermediate electrode layer 39 that serves as an upper electrode of the second variable resistance element 40 and a lower electrode of the second diode element 43. Furthermore, the sixth interlayer insulating layer 46 is formed above the fifth interlayer insulating layer 35 including the second intermediate electrode layer 39, for embedding the second diode element 43 and the second upper layer copper line 44, and (i) the second semiconductor layer 41 and the second upper electrode 42 which are included in the second diode element 43 and (ii) the second upper layer copper line 44 are embedded in the sixth interlayer insulating layer 46, to be connected to the second intermediate electrode layer 39 in a shape of a strip crossing the first upper layer copper line 24.

Next, the third electrode seed layer 48 is formed above the second upper layer copper line 44. In addition, the seventh interlayer insulating layer 47 is formed above the third electrode seed layer 48. In the seventh interlayer insulating layer 47, a memory cell hole is provided at the position corresponding to (i) each of the variable resistance elements in the first stage including the first variable resistance element 25 and (ii) each of the variable resistance elements in the second stage including the second variable resistance element 40, and the third noble metal electrode layer 49, the third variable resistance layer 50, and the third intermediate electrode layer 51 are formed in the memory cell hole.

Furthermore, the eighth interlayer insulating layer 57 is formed above the seventh interlayer insulating layer 47 including the third intermediate electrode layer 51. In the eighth interlayer insulating layer 57, (i) the third semiconductor layer 53 and the third upper electrode 54 which are included in the third diode element 55 and (ii) the third upper layer copper line 56 are embedded in the eighth interlayer insulating layer 57, to be connected to the third intermediate electrode layer 51 in a shape of a strip crossing the second upper layer copper line 44.

It is to be noted that the first variable resistance element 25 is made up of the first noble metal electrode layer 22, the first variable resistance layer 23, and the first intermediate electrode layer 30. In addition, the first diode element 33 is made up of the first intermediate electrode layer 30, the first semiconductor layer 31, and the first upper electrode 32. In addition, the second variable resistance element 40 is made up of the second noble metal electrode layer 37, the second variable resistance layer 38, and the second intermediate electrode layer 39. In addition, the second diode element 43 is made up of the second intermediate electrode layer 39, the second semiconductor layer 41, and the second upper electrode 42. In addition, the third variable resistance element 52 is made up of the third noble metal electrode layer 49, the third variable resistance layer 50, and the third intermediate electrode layer 51. In addition, the third diode element 55 is made up of the third intermediate electrode layer 51, the third semiconductor layer 53, and the third upper electrode 54.

The lower layer copper line 18 is connected to the source region 12a of the active element 12 via the embedded conductor 17, the line 15, and the embedded conductor 14. In addition, the upper layer copper line 24 is connected, in the same manner, to another active element via the embedded conductor and the semiconductor electrode line (illustration omitted). In addition, the second upper layer copper line 44 is connected to the source region 12a of another active element 12 via the embedded conductor 45, the embedded conductor 34, the embedded conductor 17, the line 15, and the embedded conductor 14, as shown in FIG. 15. In addition, the third upper layer copper line 56 is connected, in the same manner as the first upper layer copper line 24, to another active element via the embedded conductor and the semiconductor electrode line (illustration omitted).

Each of the lower layer copper line 18 and the first upper layer copper line 24 in the first stage serves as a corresponding one of the bit line and the word line, and each of the first upper copper line 24 and the second upper copper line 44 serves as a corresponding one of the bit line and the word line. However, it is designed such that, in the case where the first upper layer copper line 24 is the bit line in the first stage, the first upper layer copper line 24 is the bit line in the second stage as well, and the second upper layer copper line 44 is the word line. In addition, it is designed such that, in the case where the second upper layer copper line 44 is the word line, the third upper layer copper line 56 is the bit line.

In the case of the variable resistance nonvolatile memory device 500 according to the present embodiment as described above, since the diode element 33, the second diode element 43, and the third diode element 55 are provided to the variable resistance element 25, the second variable resistance element 40, and the third variable resistance element 52, respectively, in each of the stages, it is possible to stably and reliably perform writing and reading of the variable resistance element 25, the second variable resistance element 40, and the third variable resistance element 52, which are provided in each of the stages.

In the manufacturing process of the variable resistance nonvolatile memory device 500 having a multistage configuration of at least two stages including the variable resistance element and the diode element which are provided in each of stages, it is basically only necessary to repeat the manufacturing process explained in the description for the variable resistance nonvolatile memory device 400 according to Embodiment 4.

The variable resistance nonvolatile memory device 500 formed by stacking a plurality of the variable resistance nonvolatile memory devices 400 as the basic configuration has been explained; however, the basic configuration to be stacked is not limited to the variable resistance nonvolatile memory device 400.

It is also possible, for example, to configure an modification of the variable resistance nonvolatile memory device 500 by stacking a plurality of variable resistance nonvolatile memory devices each of which includes the diode element 33 added to the variable resistance nonvolatile memory device 200 or the variable resistance nonvolatile memory device 300, which have been explained as modifications of the variable resistance nonvolatile memory device 400 in Embodiment The variable resistance nonvolatile memory device according to the present invention has a cross-point configuration which allows miniaturization and larger capacity, and is useful in a variety of electronic devices in which a nonvolatile storage device is used because it is possible to form a memory cell configuration which has been difficult to implement with conventional manufacturing methods.

The invention claimed is:

1. A method of manufacturing a variable resistance nonvolatile memory device, said method comprising:
 a step (A) of forming a plurality of lower layer copper lines on a substrate, each of the lower layer copper lines being shaped into a strip;
 a step (B) of forming a plurality of electrode seed layers each of which is shaped into the strip and disposed on a surface of a corresponding one of the lower layer copper lines, using electroless selective growth plating with which a metal thin film is precipitated not on an insulating body but only on the surfaces of the lower layer copper lines, each of the lower layer copper lines comprising a conductive material;
 a step (D2) of forming an interlayer insulating layer above the electrode seed layers and the substrate;
 a step (E2) of forming a plurality of memory cell holes in the interlayer insulating layer, each of the memory cell holes penetrating through the interlayer insulating layer and extending to a corresponding one of the electrode seed layers;
 a step (C2) of forming a plurality of noble metal electrode layers each of which is disposed on an exposed surface of a corresponding one of the electrode seed layers in a corresponding one of the memory cell holes, using the electroless selective growth plating;
 a step (F) of forming a plurality of variable resistance layers each of which is connected to the noble metal electrode layer in a corresponding one of the memory cell holes; and
 a step (G) of forming, above the interlayer insulating layer and the variable resistance layers, a plurality of upper layer copper lines each of which is (i) connected to a corresponding one of the variable resistance layers and (ii) shaped into a strip that crosses the lower layer copper lines.

2. The method of manufacturing a variable resistance nonvolatile memory device according to claim 1,
 wherein a metal layer comprising platinum or palladium is formed as the noble metal electrode layer.

3. The method of manufacturing a variable resistance nonvolatile memory device according to claim 1,
 wherein a metal layer comprising one of nickel, a nickel-phosphorus alloy, and a nickel-boron alloy is formed as the electrode seed layer, and a metal layer comprising one of platinum and palladium is formed as the noble metal electrode layer.

4. The method of manufacturing a variable resistance nonvolatile is memory device according to claim 1,
 wherein a metal layer comprising one of a metal and an alloy is formed as the electrode seed layer, the one of the metal and the alloy having an ionization tendency greater than an ionization tendency of the noble metal electrode layer.

5. The method of manufacturing a variable resistance nonvolatile memory device according to claim 1,
 wherein a metal layer comprising one of zinc, iron, and palladium is formed as the electrode seed layer, and a metal layer comprising platinum is formed as the noble metal electrode layer.

6. The method of manufacturing a variable resistance nonvolatile memory device according to claim 1,
 wherein a metal layer comprising one of zinc and iron is formed as the electrode seed layer, and a metal layer comprising palladium is formed as the noble metal electrode layer.

7. The method of manufacturing a variable resistance nonvolatile memory device according to claim 1, said method further comprising,
 between said step (F) and said step (G), a step (H) of forming a plurality of diode elements each of which is disposed on and connected to a corresponding one of the variable resistance layers.

8. The method of manufacturing a variable resistance nonvolatile memory device according to claim 7,
 wherein said steps (B), (D2), (E2), (C2), (F), (H), and (G) are repeated, using the upper layer copper lines as another plurality of lower layer copper lines, to form: another plurality of electrode seed layers; another plurality of noble metal electrode layers; another plurality of variable resistance layers; another plurality of diode elements; and another plurality of upper layer copper lines, above the upper layer copper lines.

9. The method of manufacturing a variable resistance nonvolatile memory device according to claim 1,
 wherein said step (F) includes:
 a step (F1) of forming a first variable resistance layer in each of the memory cell holes, the first variable resistance layer being connected to a corresponding one of the noble metal electrode layers; and
 a step (F2) of forming a second variable resistance layer above the first variable resistance layer in the each of the memory cell holes, and
 the first variable resistance layer and the second variable resistance layer comprise an oxide of a same metal and the first variable resistance layer has an oxygen content atomic percentage higher than an oxygen content atomic percentage of the second variable resistance layer.

10. A variable resistance nonvolatile memory device, comprising:
 a substrate;
 a plurality of lower layer copper lines formed on said substrate, each of said lower layer copper lines being shaped into a strip;
 a plurality of electrode seed layers each of which is shaped into the strip and formed only on a surface of a corresponding one of said lower layer copper lines;
 an interlayer insulating layer formed above said electrode seed layers and said substrate;
 a plurality of noble metal electrode layers each of which is flatly formed only on a surface of said electrode seed layer in a corresponding one of memory cell hole regions penetrating through said interlayer insulating layer and extending to said electrode seed layers, said noble metal electrode layer being connected to said electrode seed layer;
 a plurality of variable resistance layers each of which is formed in a corresponding one of the memory cell hole regions and connected to a corresponding one of said noble metal electrode layers; and a plurality of upper layer copper lines formed above said interlayer insulating layer and said variable resistance layers, each of said upper layer copper lines being (i) connected to a corresponding one of said variable resistance layers and (ii) shaped into a strip that crosses said lower layer copper lines.

11. The variable resistance nonvolatile memory device according to claim 10,
wherein said noble metal electrode layer comprises platinum or palladium.

12. The variable resistance nonvolatile memory device according to claim 10,
wherein said electrode seed layer comprises one of nickel, a nickel-phosphorus alloy, and a nickel-boron alloy, and said noble metal electrode layer comprises one of platinum and palladium.

13. The variable resistance nonvolatile memory device according to claim 10,
wherein said electrode seed layer comprises one of a metal and an alloy each of which shows an ionization tendency greater than an ionization tendency of said noble metal electrode layer.

14. The variable resistance nonvolatile memory device according to claim 10,
wherein said electrode seed layer comprises one of zinc, iron, and palladium, and said noble metal electrode layer comprises platinum.

15. The variable resistance nonvolatile memory device according to claim 10,
wherein said electrode seed layer comprises one of zinc and iron, and said noble metal electrode layer comprises palladium.

16. The variable resistance nonvolatile memory device according to claim 10, further comprising
a plurality of diode elements each of which is disposed on and connected to a corresponding one of said variable resistance layer.

17. The variable resistance nonvolatile memory device according to claim 16,
wherein at least one structural unit is further stacked which has a same structure as a structure of a structural unit that includes said lower layer copper lines, said electrode seed layers, said interlayer insulating layer, said noble metal electrode layers, said variable resistance layers, said diode elements, and said upper layer copper lines, and
said upper layer copper lines included in the structural unit positioned below serve also as said lower layer copper lines in the structural unit positioned immediately above.

18. The variable resistance nonvolatile memory device according to claim 10,
wherein each of said variable resistance layers includes:
a first variable resistance layer formed in a corresponding one of the memory cell hole regions, to be connected to a corresponding one of said noble metal electrode layers; and
a second variable resistance layer formed above said first variable resistance layer in the memory cell hole region, and
said first variable resistance layer and said second variable resistance layer comprise an oxide of a same metal and said first variable resistance layer has an oxygen content atomic percentage higher than an oxygen content atomic percentage of said second variable resistance layer.

* * * * *